(12) United States Patent
Elsherbini et al.

(10) Patent No.: US 11,393,777 B2
(45) Date of Patent: Jul. 19, 2022

(54) MICROELECTRONIC ASSEMBLIES

(71) Applicant: Intel Corporation, Santa Clara, CA (US)

(72) Inventors: Adel A. Elsherbini, Chandler, AZ (US); Patrick Morrow, Portland, OR (US); Henning Braunisch, Phoenix, AZ (US); Kimin Jun, Portland, OR (US); Brennen Mueller, Portland, OR (US); Shawna M. Liff, Scottsdale, AZ (US); Johanna M. Swan, Scottsdale, AZ (US); Paul B. Fischer, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 9 days.

(21) Appl. No.: 16/651,888

(22) PCT Filed: Dec. 29, 2017

(86) PCT No.: PCT/US2017/068901
§ 371 (c)(1),
(2) Date: Mar. 27, 2020

(87) PCT Pub. No.: WO2019/132957
PCT Pub. Date: Jul. 4, 2019

(65) Prior Publication Data
US 2020/0235061 A1    Jul. 23, 2020

(51) Int. Cl.
*H01L 23/64* (2006.01)
*H01L 23/66* (2006.01)
(Continued)

(52) U.S. Cl.
CPC ............ *H01L 23/645* (2013.01); *H01L 23/34* (2013.01); *H01L 23/66* (2013.01); *H01L 28/10* (2013.01); *H01L 2223/6677* (2013.01)

(58) Field of Classification Search
CPC .................................................... H01L 23/645
See application file for complete search history.

(56) References Cited

U.S. PATENT DOCUMENTS

2002/0172025 A1* 11/2002 Megahed .......... H01L 23/49827
                                                              361/767
2006/0043567 A1*  3/2006 Palanduz ................ H01L 23/15
                                                              257/E23.009

(Continued)

FOREIGN PATENT DOCUMENTS

| KR | 1020100023225 A | 3/2010 |
| KR | 1020110111232 A | 10/2011 |
| WO | 2019132957 A1 | 7/2019 |

OTHER PUBLICATIONS

PCT Sep. 28, 2018 International Search Report and Written Opinion of the International Searching Authority for International Application No. PCT/US2017/06890; 15 pages.

*Primary Examiner* — Omar F Mojaddedi
(74) *Attorney, Agent, or Firm* — Patent Capital Group

(57) ABSTRACT

Microelectronic assemblies, and related devices and methods, are disclosed herein. For example, in some embodiments, a microelectronic assembly may a die having a front side and a back side, the die comprising a first material and conductive contacts at the front side; and a thermal layer attached to the back side of the die, the thermal layer comprising a second material and a conductive pathway, wherein the conductive pathway extends from a front side of the thermal layer to a back side of the thermal layer.

18 Claims, 23 Drawing Sheets

(51) Int. Cl.
*H01L 23/36* (2006.01)
*H01L 23/538* (2006.01)
*H01L 23/49* (2006.01)
*H01L 23/34* (2006.01)
*H01L 49/02* (2006.01)

(56) References Cited

U.S. PATENT DOCUMENTS

| | | |
|---|---|---|
| 2008/0002380 A1 | 1/2008 | Hazucha et al. |
| 2012/0162947 A1* | 6/2012 | O'Donnell ............... H01L 25/16 257/532 |
| 2013/0221506 A1* | 8/2013 | Zhao ..................... H01L 23/373 257/676 |
| 2016/0197014 A1 | 7/2016 | Yu et al. |
| 2016/0379967 A1 | 12/2016 | Gamini |
| 2017/0033031 A1* | 2/2017 | Dungan ................... H01L 23/58 |
| 2019/0074264 A1* | 3/2019 | Chen ................... H01L 23/5383 |

* cited by examiner

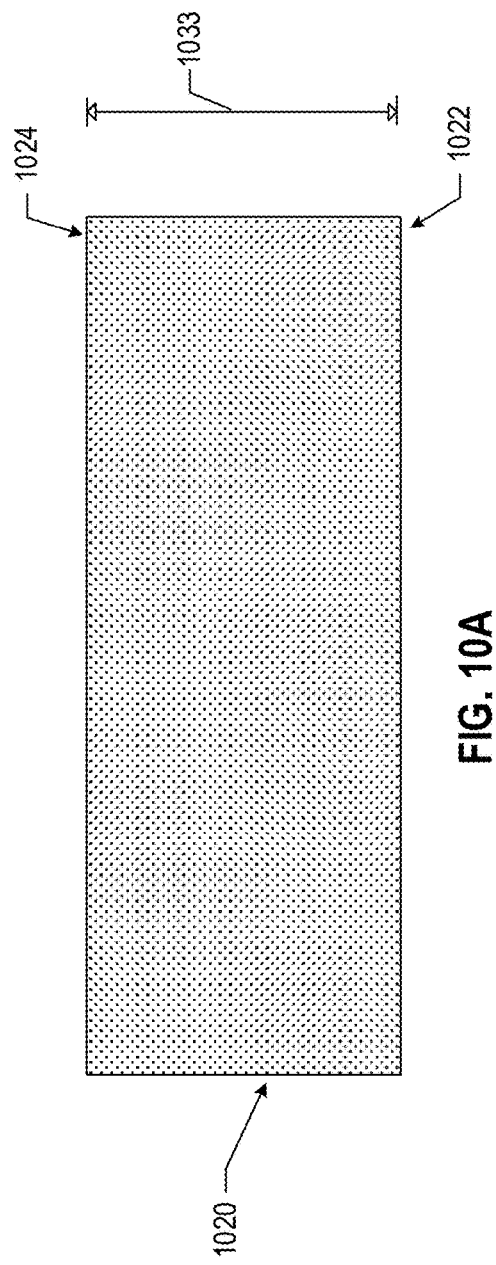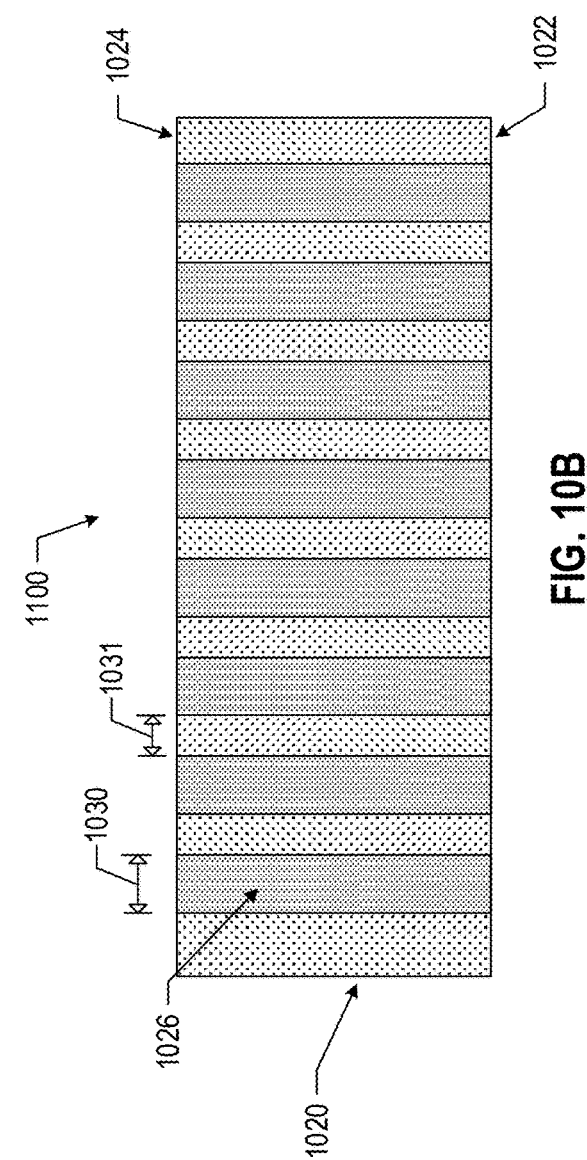
FIG. 10A
FIG. 10B

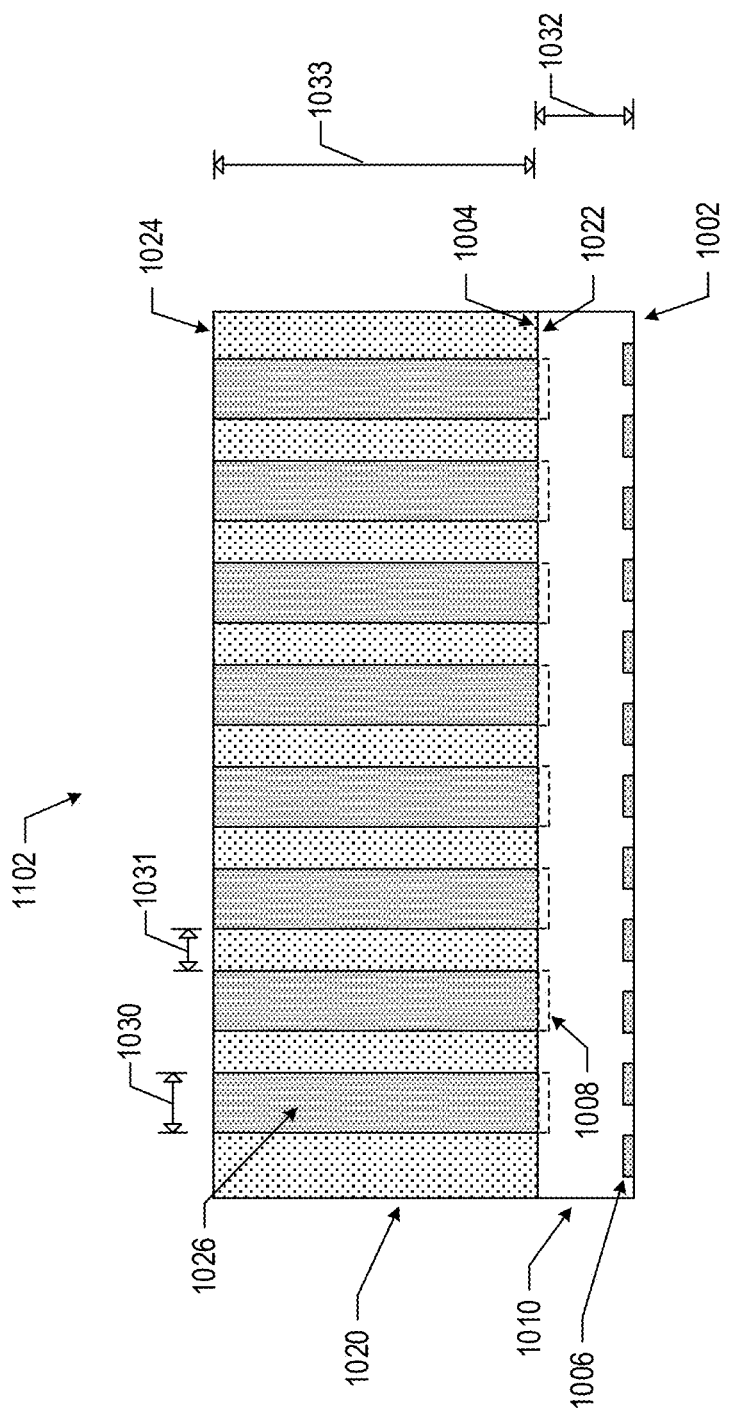

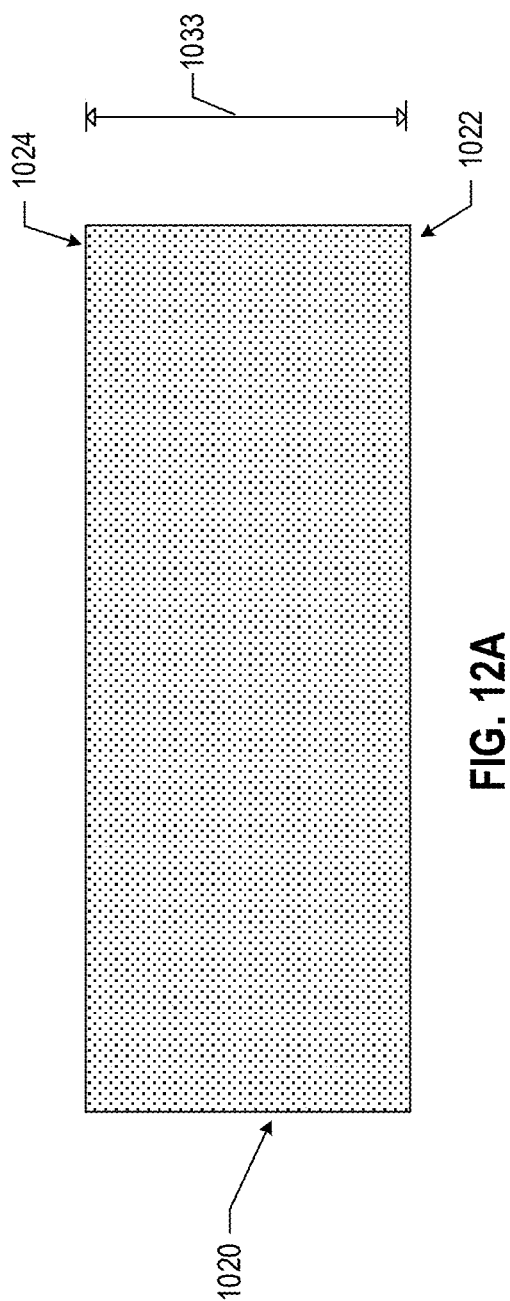

ature, in accordance with any of the
MICROELECTRONIC ASSEMBLIES

CROSS-REFERENCE TO RELATED APPLICATION

This application is a national stage application under 35 U.S.C. § 371 of PCT International Application Serial No. PCT/US2017/068901, filed on Dec. 29, 2017 and entitled "MICROELECTRONIC ASSEMBLIES," which is hereby incorporated by reference herein in its entirety.

BACKGROUND

Integrated circuit devices (e.g., dies) are typically coupled together to integrate features or functionality and to facilitate connections to other components, such as circuit boards. However, current techniques for coupling integrated circuit devices are limited by manufacturing, device size, thermal considerations, and interconnect congestion, which may impact costs and implementations.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, not by way of limitation, in the figures of the accompanying drawings.

FIGS. 10A-10D are side, cross-sectional views of various stages in an example process for manufacturing the microelectronic assembly of FIG. 1, in accordance with various embodiments.

FIGS. 12A-12D are side, cross-sectional views of various stages in another example process for manufacturing the microelectronic assembly of FIG. 1, in accordance with various embodiments.

DETAILED DESCRIPTION

Figure 1:
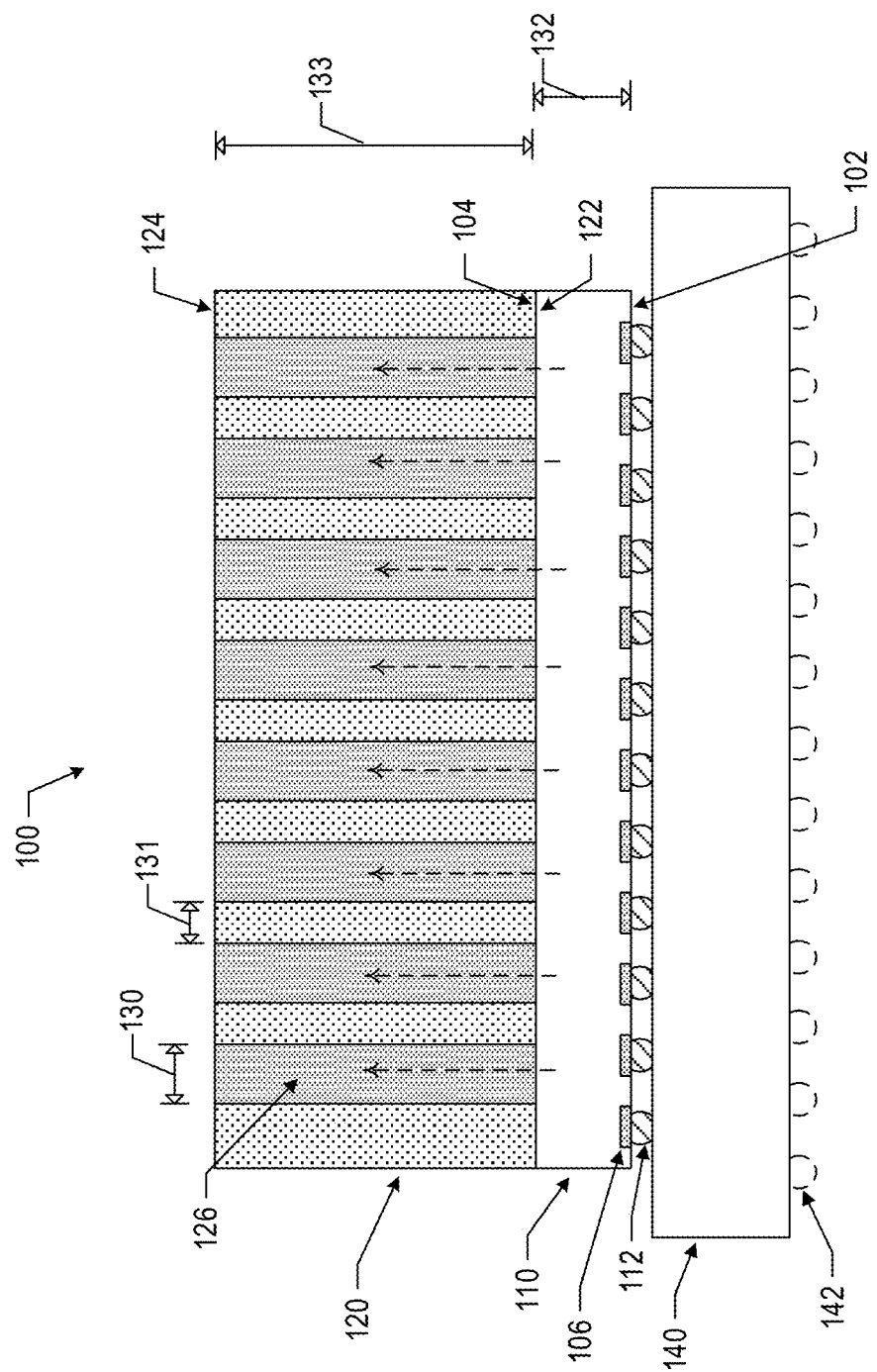
FIG. 1 is a side, cross-sectional view of an example microelectronic assembly, in accordance with various embodiments.

Microelectronic assemblies, and related devices and methods, are disclosed herein. For example, in some embodiments, a microelectronic assembly may include a die having a front side and a back side, the die comprising a first material and conductive contacts at the front side; and a thermal layer attached to the back side of the die, the thermal layer comprising a second material and a conductive pathway, wherein the conductive pathway extends from a front side of the thermal layer to a back side of the thermal layer.

Communicating large numbers of signals between two or more dies in a multi-die integrated circuit (IC) package, sometimes referred to as a "composite die," is challenging due to the increasingly small size of such dies, thermal constraints, and power delivery constraints, among others. Various ones of the embodiments disclosed herein may help achieve reliable attachment of multiple IC dies at a lower cost, with improved power efficiency, with higher bandwidth, and/or with greater design flexibility, relative to conventional approaches. Various ones of the microelectronic assemblies disclosed herein may exhibit better power delivery, thermal dissipation (e.g., moving heat away from a die), and/or signal speed while reducing the size of the package relative to conventional approaches. The microelectronic assemblies disclosed herein may be particularly advantageous for small and low-profile applications in computers, tablets, industrial robots, and consumer electronics (e.g., wearable devices).

In the following detailed description, reference is made to the accompanying drawings that form a part hereof wherein like numerals designate like parts throughout, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The drawings are not necessarily to scale. Although many of the drawings illustrate rectilinear structures with flat walls and right-angle corners, this is simply for ease of illustration, and actual devices made using these techniques will exhibit rounded corners, surface roughness, and other features.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. As used herein, a "package" and an "IC package" are synonymous, as are a "die" and an "IC die." The terms "top" and "bottom" may be used herein to explain various features of the drawings, but these terms are simply for ease of discussion, and do not imply a desired or required orientation. As used herein, the term "insulating" may mean "electrically insulating," unless otherwise specified.

When used to describe a range of dimensions, the phrase "between X and V" represents a range that includes X and Y. For convenience, the phrase "FIG. 10" may be used to refer to the collection of drawings of FIGS. 10A-10D, the phrase "FIG. 7" may be used to refer to the collection of drawings of FIGS. 7A-7B, etc. although certain elements may be referred to in the singular herein, such elements may include multiple sub-elements. For example, "an insulating material" may include one or more insulating materials. As used herein, a "conductive contact" may refer to a portion of conductive material (e.g., metal) serving as an electrical interface between different components; conductive contacts may be recessed in, flush with, or extending away from a surface of a component, and may take any suitable form (e.g., a conductive pad, socket, bump, or pillar, or portion of a conductive line or via).

FIG. 1 is a side, cross-sectional view of a microelectronic assembly 100, in accordance with various embodiments. A number of elements are illustrated in FIG. 1 as included in the microelectronic assembly 100, but a number of these elements may not be present in a microelectronic assembly 100. For example, in various embodiments, the first-level interconnects 112, the package substrate 140 and/or the second-level interconnects 142 may not be included. Further, FIG. 1 illustrates a number of elements that are omitted from subsequent drawings for ease of illustration, but may be included in any of the microelectronic assemblies 100 disclosed herein. Examples of such elements include the first-level interconnects 112, the package substrate 140, and/or the second-level interconnects 142. Many of the elements of the microelectronic assembly 100 of FIG. 1 are included in other ones of the accompanying figures; the discussion of these elements is not repeated when discussing these figures, and any of these elements may take any of the forms disclosed herein. In some embodiments, individual ones of the microelectronic assemblies 100 disclosed herein may serve as a system-in-package (SiP) in which multiple dies 110 having different functionality are included. In such embodiments, the microelectronic assembly 100 may be referred to as a SiP.

The microelectronic assembly 100 may include a die 110 attached to a thermal layer 120 at a back side 104 of the die 110 and a front side 122 of the thermal layer 120. The thermal layer 120 may include one or more conductive pathways 126 extending between the front side 122 of the thermal layer 120 and a back side 124 of the thermal layer 120. The conductive pathways 126 in the thermal layer 120 may be bordered by liner materials, such as adhesion liners and/or barrier liners, as suitable. In some instances, the conductive pathways 126 may be referred to as thru-semiconductor vias (TSVs). In some instances, the thermal layer 120 may be referred to as a die. The conductive pathways 126 may be composed of a conductive material. In some embodiments, the conductive material may be a metal such as copper, aluminum, gold, silver, combinations thereof (e.g., alloys or layers of different metals), or the like. In some embodiments, the conductive material may be a composite such as aluminum nitride, barium oxide, graphene, or the like. The die 110 may include conductive contacts 106 at a front side 102 of the die 110. In various embodiments, the conductive contacts 106 may have a pitch between 5 microns and 200 microns. In some embodiments, the die 110 may be a single-sided die. In other embodiments, the die 110 may be a double-sided die.

As referred to herein in this Specification, a double-sided die is a die that has interconnect layers (e.g., a metallization stack) on both sides (e.g., a front side and an opposing back side) of a device layer (which can potentially include multiple device layers) of the die. In a double-sided die, a device layer (which can potentially include multiple device layers) may be sandwiched by two metallization stacks providing conductive pathways (e.g., conductive lines and vias) between the device layer and the conductive contacts at the sides or faces of the die, or by a metallization stack providing conductive pathways between the device layer and the conductive contacts at one face (side) of the die and a semiconductor substrate with TSVs providing conductive pathways between the device layer and the conductive contacts at the other face (side) of the die.

The thermal layer 120 may be attached to the die 110 using any suitable technique including, but not limited to, layer transfer techniques, metal-to-metal attachment techniques, solder techniques, anisotropic conductive material techniques, direct bonding techniques, hybrid bonding techniques, or the like. In particular, the front side 122 of the thermal layer 120 may be attached to an interconnect dielectric of an interconnect layer (not shown in FIG. 1) at the back side 104 of the die 110. In some embodiments, one or more of the conductive pathways 126 may be electrically active in the sense that they may be electrically connected to one or more electronic devices (e.g., transistors) of the device layer(s) of the die 110. In some embodiments, one or more of the conductive pathways 126 may be electrically passive in the sense that they may not be electrically connected to one or more electronic device of the device layer(s) of the die 110. In some embodiments, the thermal layer 120 may not be electrically active; however, in other embodiments, the thermal layer 120 may be electrically active. In some embodiments, if the conductive pathways are not to be electrically connected to the die 110, a barrier layer (not shown), which may range in thickness between 250 nanometers to less than 1 micron.

In some attachment techniques that utilize direct bonding, a first die or wafer having copper or other metal pads may be placed, typically at room temperature, on a second die or wafer also having matching copper or metal pads (e.g., to perform die-to-wafer bonding, die-to-die bonding, or wafer-to-wafer bonding). Force and heat are then applied to the dies and/or wafers to form a bond between metal pads and the surrounding dielectrics on the dies and/or wafers. In some embodiments, a polymer material is disposed on one or both wafers that cures with the applied heat to form a permanent bond between the surface of the dies/wafers.

In some attachment techniques that utilize hybrid bonding, a dielectric material (e.g., silicon oxide, silicon nitride, or silicon carbide, among others) may be present between the dies or wafers bonded together (e.g., between copper pads or posts that provide the associated conductive contacts). For hybrid bonding, dies or wafers may be bonded together under elevated pressure and/or temperature (e.g., thermal compression bonding).

The conductive pathways 126 may be formed in the thermal layer 120 using any suitable techniques such as laser drilling, mechanical drilling, or plasma etching and filling with a metal using sputtering or plating. Although FIG. 1 illustrates a specific number and arrangement of conductive pathways 126 in the thermal layer 120, these are simply illustrative and any suitable number and arrangement may be used. The conductive pathways 126 may be formed of any appropriate conductive material, such as copper, silver, nickel, gold, aluminum, or other metals or alloys, for example. Further, although the conductive pathways 126 are shown as having substantially parallel sidewalls, the conductive pathways 126 may have any profile (e.g., as may be dictated by the manufacturing processes used to form the conductive pathways 126). For example, the sidewalls of a conductive pathway 126 may be tapered, scalloped, or may be otherwise non-parallel with each other.

The elements of the microelectronic assembly 100 and/or other microelectronic assemblies disclosed herein may have any suitable dimensions. The conductive pathways 126 may have a width 130, which may range between 1 micron and 300 microns, and a spacing distance 131, which may range between 2 microns and 600 microns. The die 110 may have a thickness 132 and the thermal layer 120 may have a thickness 133. In some embodiments, the thickness 132 of the die 110 may range between 10 microns and 30 microns for ultra-thin dies. In other embodiments, the thickness 132 of the die 110 may range between 80 microns and 780 microns for other dies. In some embodiments, the thickness 133 of the thermal layer may range between 50 microns and 300 microns.

The die 110 may be composed of a first material and the thermal layer 120 may be composed of a second material. The first material of the die 110 may be composed of a semiconductor material. In some embodiments, the second material of the thermal layer 120 may be composed of a semiconductor material; however, in other embodiments, it may not be composed of a semiconductor material. In some embodiments, the first material of the die 110 and the second material of the thermal layer 120 may be different; however, in other embodiments, the first material of the die 110 and the second material of the thermal layer 120 may be the same. In some embodiments, the second material of the thermal layer 120 may be selected based on a coefficient of thermal expansion (CTE) of the second material being similar to the CTE of the first material of the die 110 and/or may be based on the second material of the thermal layer 120 having a higher modulus of elasticity (e.g., being stiffer) than the first material of the die 110. In still some embodiments, if the second material of the thermal layer 120 is a semiconductor material, the semiconductor material may be selected based on electrical characteristics (e.g., resistivity, loss, etc.) of the semiconductor material.

As discussed herein, the conductive pathways 126 may be formed in the thermal layer 120 having any width and/or spacing to provide one or more purposes depending on design and/or implementation, which may provide various advantages. In particular, the conductive pathways 126 may be formed in the thermal layer 120 using processes that may be separate from processes used to form electrical devices in the device layer(s) of the die 110. Thus, the formation of the conductive pathways 126 for the thermal layer 120 may be advantageously decoupled from the formation of devices of the device layer(s) of the die 110 such that the number of conductive pathways 126, the width 130, and/or the spacing distance 131 may minimally impact device (e.g., transistor) density of the die 110 and/or interconnect routing within the die 110.

In addition, in some embodiments the conductive pathways 126 may provide high density and/or high bandwidth die-to-die interconnects that may minimally impact device density of the die 110 and/or interconnect routing within the die 110. For example, in some embodiments, the conductive pathways 126 may provide back side interconnects for stacking additional die(s) within the microelectronic assembly 100.

In still some embodiments, the conductive pathways 126 may provide improved thermal performance for the die 110. For example, copper may be 3-4 times more thermally conductive than silicon, which may improve heat dissipation (represented by the dashed-line arrows) away from the die 110 through via the conductive pathways 126. Consider an example in which the die 110 may be a processor, improving heat dissipation away from the processor may allow it to be operated at higher clock frequencies or speeds, which may improve operating performance or efficiency for the processor. In some embodiments, the conductive pathways 126 may be formed in an area that is a thermal "hot spot" for the die 110 to improve thermal dissipation for the area. In still some embodiments, the conductive pathways 126 may be formed across an X-Y area that may provide heat dissipation for a portion or the entirety of the die 110.

In still some embodiments, the conductive pathways 126 may be used to form a portion of electrical devices (FIGS. 7-8) that may be formed on the back side 124 of the thermal layer 120. For example, in some embodiments the thermal layer 120 may be composed of a high resistivity silicon, a glass, a ceramic, or the like, which may provide improved Radio Frequency (RF) performance for electrical devices and/or power structures (e.g., inductors such as power delivery inductors or high quality-factor (Q-factor) RF inductors, antennas, antenna arrays, transformers, etc.) that may be formed on the back side 124 of the thermal layer 120. In still some embodiments, the thermal layer 120 may be composed of a high resistivity silicon, a glass, a ceramic, or the like, which may improve bandwidth of the conductive pathways 126 due to reduced capacitance between individual ones of the conductive pathways 126. In still some embodiments, the thermal layer 120 may be composed of a glass, a ceramic, or the like to provide improved electrical, thermal, and/or mechanical performance. Other potential materials that may be selected for the thermal layer 120 and/or the die 110 are discussed below.

The microelectronic assembly of FIG. 1 may also include a package substrate 140. The microelectronic assembly may be coupled to the package substrate 140 by first-level interconnects 112. In particular, conductive contacts 106 at the front side 102 of the die 110 may be electrically and mechanically coupled to conductive contacts (not shown) of the package substrate 140 by the first-level interconnects 112. The first-level interconnects 112 illustrated in FIG. 1 are solder balls (e.g., for a ball grid array arrangement), but any suitable first-level interconnects 112 may be used (e.g., solder, non-solder, pins in a pin grid array arrangement, lands in a land grid array arrangement, wirebond, or copper pillar with solder cap). In some embodiments, the package substrate 140 may be coupled to a circuit board (not shown) by second-level interconnects 142 using any suitable technique. The second-level interconnects 142 illustrated in FIG. 1 are solder balls (e.g., for a ball grid array arrangement), but any suitable second-level interconnects 142 may be used (e.g., solder, non-solder, pins in a pin grid array arrangement, lands in a land grid array arrangement, wirebond, or copper pillar with solder cap).

The package substrate 140 may include an insulating material (e.g., e.g., a dielectric material formed in multiple layers, as known in the art) and one or more conductive pathways through the dielectric material (e.g., including conductive traces and/or conductive vias). In some embodiments, the insulating material of the package substrate 140 may be a dielectric material, such as an organic dielectric material, a fire retardant grade 4 material (FR-4), bismaleimide triazine (BT) resin, polyimide materials, glass reinforced epoxy matrix materials, or low-k and ultra low-k dielectric (e.g., carbon-doped dielectrics, fluorine-doped dielectrics, porous dielectrics, and organic polymeric dielectrics). In particular, when the package substrate 140 is formed using standard printed circuit board (PCB) processes, the package substrate 140 may include FR-4, and the conductive pathways in the package substrate 140 may be formed by patterned sheets of copper separated by build-up layers of the FR-4. The conductive pathways in the package substrate 140 may be bordered by liner materials, such as adhesion liners and/or barrier liners, as suitable.

The die 110, among others disclosed herein, may include circuitry, which may include one or more device layers including active or passive circuitry (e.g., transistors, diodes, resistors, inductors, capacitors, among others) and one or more interconnect layers (e.g., as discussed below with reference to FIGS. 14-15). In various embodiments, one or more interconnect layers may be present on one or both sides of circuitry for the die 110 (e.g., as discussed below with reference to FIGS. 14-15). In some embodiments, the die 110 may be the source and/or destination of signals communicated between the die 110 and other dies included in the microelectronic assembly 100. In some embodiments, interconnect layers for a die (e.g., die 110, etc.) may include conductive pathways to route power, ground, and/or signals between different ones of the die 110 and/or between the die 110 and the package substrate 140.

The die 110, among others disclosed herein, may include an insulating material (e.g., a dielectric material formed in multiple layers, or semiconductor material, as known in the art) and multiple conductive pathways formed through the insulating material. In some embodiments, the insulating material of the die 110 may include a dielectric material, such as BT resin, polyimide materials, glass reinforced epoxy matrix materials, oxide-based materials (e.g., silicon dioxide or spin on oxide), or low-k and ultra low-k dielectric (e.g., carbon-doped dielectrics, fluorine-doped dielectrics, porous dielectrics, and organic polymeric dielectrics). For example, the die 110 may include a dielectric build-up film. In some embodiments, the insulating material of the die 110 may be a semiconductor material, such as silicon, germanium, indium antimonide, lead telluride, indium arsenide, indium phosphide, gallium arsenide, or gallium antimonide. Further insulating materials classified as group II-VI, III-V, or IV may also be used as the insulating materials of die 110.

The die 110, among others disclosed herein, may also include a bulk or native substrate on one, both, or no sides of circuitry for a given die. The bulk substrate may be a crystalline substrate formed using a bulk silicon or a silicon-on-insulator (SOI) substructure. Other insulating materials may be used, as desired depending on design and/or implementation.

The thermal layer 120 may be composed of a material such as silicon, germanium, indium antimonide, lead telluride, indium arsenide, indium phosphide, gallium arsenide, sapphire, diamond, glass, ceramic or gallium antimonide. The thermal layer 120 may also be composed of a dielectric material, such as BT resin, polyimide materials, glass reinforced epoxy matrix materials, oxide-based materials (e.g., silicon dioxide or spin on oxide), or low-k and ultra low-k dielectric (e.g., carbon-doped dielectrics, fluorine-doped dielectrics, porous dielectrics, and organic polymeric dielectrics). The thermal layer 120 may also be composed of materials classified as group II-VI, III-V, or IV materials.

In some embodiments, an underfill material (not shown) may extend between die 110 and the package substrate 140 around associated first-level interconnects 112. The underfill material may be an insulating material, such as an appropriate epoxy material. In some embodiments, the underfill material may be an epoxy flux that assists with coupling the die 110 to the package substrate 140 when forming the first-level interconnects 112, and then polymerizes and encapsulates the interconnects. The underfill material may be selected to have a CTE that may mitigate or minimize the stress between the die 110 and the package substrate 140 arising from uneven thermal expansion in the microelectronic assembly 100. In some embodiments, the CTE of the underfill material may have a value that is intermediate to the CTE of the die 110 (e.g., the CTE of the dielectric material of the die 110) and a CTE of the package substrate 140.

Figure 2:
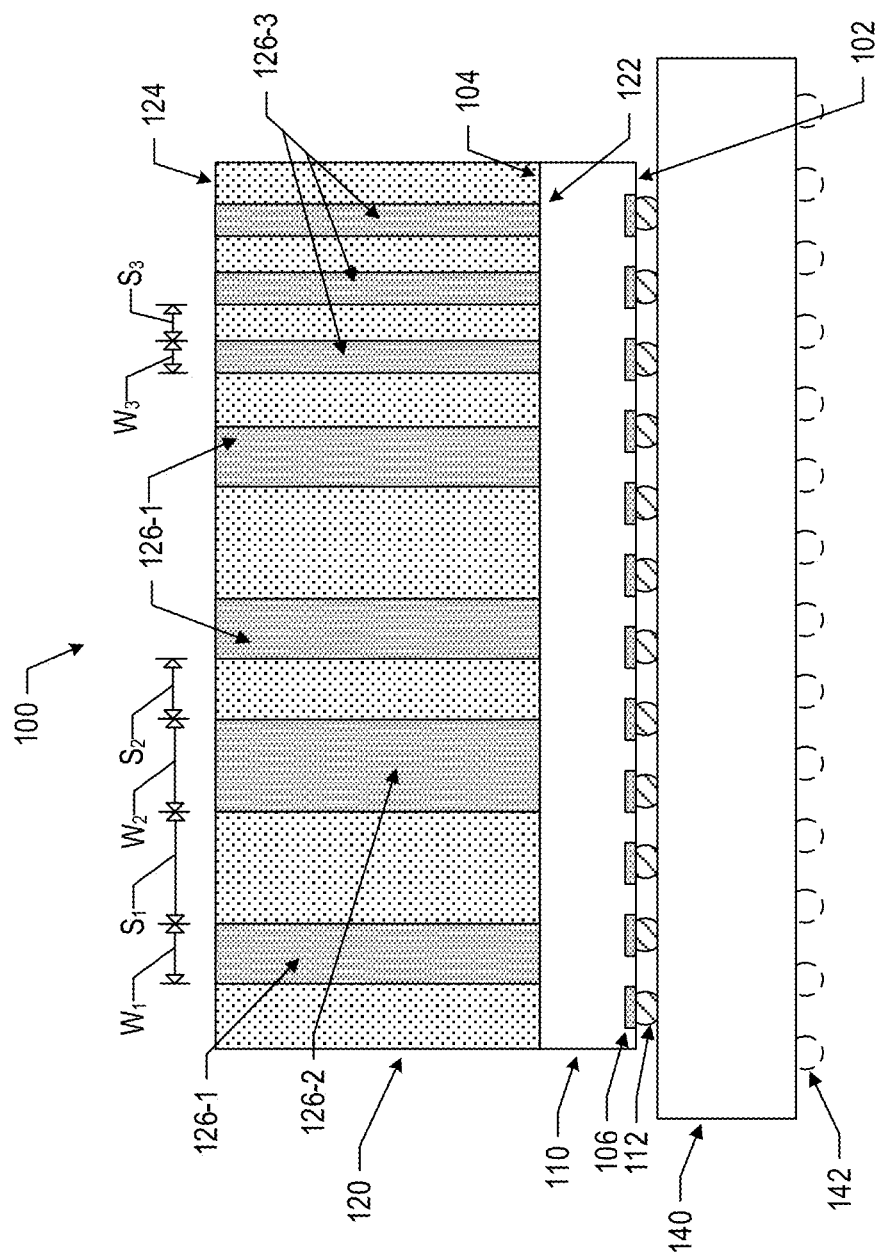
FIG. 2 is a side, cross-sectional view of an example microelectronic assembly, in accordance with various embodiments.

FIG. 2 is a side, cross-sectional view of an example microelectronic assembly 100, in accordance with various embodiments. The microelectronic assembly 100 for the embodiment of FIG. 2 illustrates multiple conductive pathways 126-1/126-2/126-3 each having a different width formed for the thermal layer 120. For example, conductive pathways 126-1 may each have a width $W_1$, conductive pathway 126-2 may have a width $W_2$, and conductive pathways 126-3 may each have a width $W_3$ in which $W_1 \neq W_2 \neq W_3$. Further, the conductive pathways 126 for the embodiment of FIG. 2 may have varied spacing between various ones of the conductive pathways. For example, a conductive pathway 126-1 and adjacent conductive pathway 126-2 may be separated by a spacing $S_1$, another adjacent conductive pathway 126-1 may be separated from the conductive pathway 126-2 by a spacing $S_2$, and adjacent conductive pathways 126-3 may be separated by a spacing $S_3$ in which $S_1 \neq S_2 \neq S_3$. Although the spacing distances illustrated in the embodiment of FIG. 2 (and FIG. 3, below) is shown with respect to the sides of adjacent conductive pathways 126, it is to be understood that the spacing distances may also be measured with respect to the centers of adjacent conductive pathways 126. As noted above, the placement of conductive pathways 126 within thermal layer 120 may be varied depending on design and/or implementation to provide various advantages.

Figure 3:
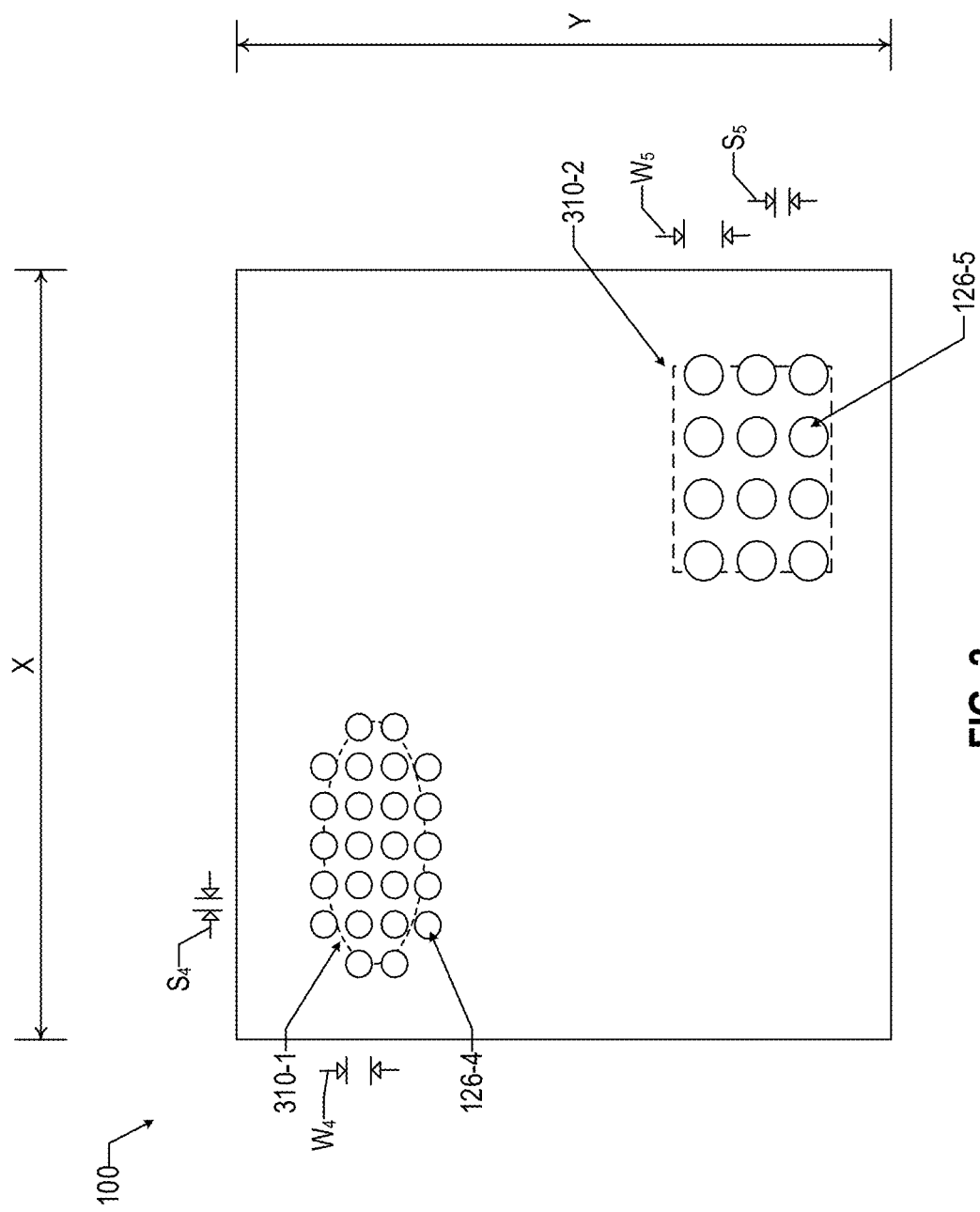
FIG. 3 is a top view of an example microelectronic assembly, in accordance with various embodiments.

One advantage may be to provide improved thermal performance of the die 110. FIG. 3 is a top view of an example microelectronic assembly 100, in accordance with various embodiments in which conductive pathways are placed in proximity to "hot spot" areas 310 that may be present for die 110 during operation. The microelectronic assembly 100 for the embodiment of FIG. 3 may have an X-Y area as illustrated. A first hot spot area 310-1 and a second hot spot area 310-2 are illustrated, each having a different representative shape such that the first hot spot area 310-1 is represented by an elliptical area and the second hot spot area 310-2 is represented by a rectangular area. It is to be understood that the hot spot areas 310 illustrated for the embodiment of FIG. 3 are provided for illustrative purposes only and are not meant to limit the broad scope of the present disclosure.

Conductive pathways 126-4 may be formed in the thermal layer 120 for the first hot spot area 310-1 such that the conductive pathways 126-4 have a footprint that aligns with the first hot spot area 310-1. The conductive pathways 126-4 may have a width (diameter) $W_4$ and a spacing distance $S_4$. Conductive pathways 126-5 may be formed in the thermal layer 120 for the second hot spot area 310-2 such that the conductive pathways 126-5 have a footprint that aligns with the second hot spot area 310-2. The conductive pathways 126-5 may have a width (diameter) $W_5$ and a spacing distance $S_5$. The width and spacing distance of the conductive pathways 126-4 ($W_4/S_4$) may be different than the width and spacing distance of the conductive pathways 126-5 ($W_5/S_5$) for the embodiment of FIG. 3. As illustrated in FIG. 3, the placement of the conductive pathways 126-4/126-5 may improve heat dissipation away from the die 110.

Figure 4:
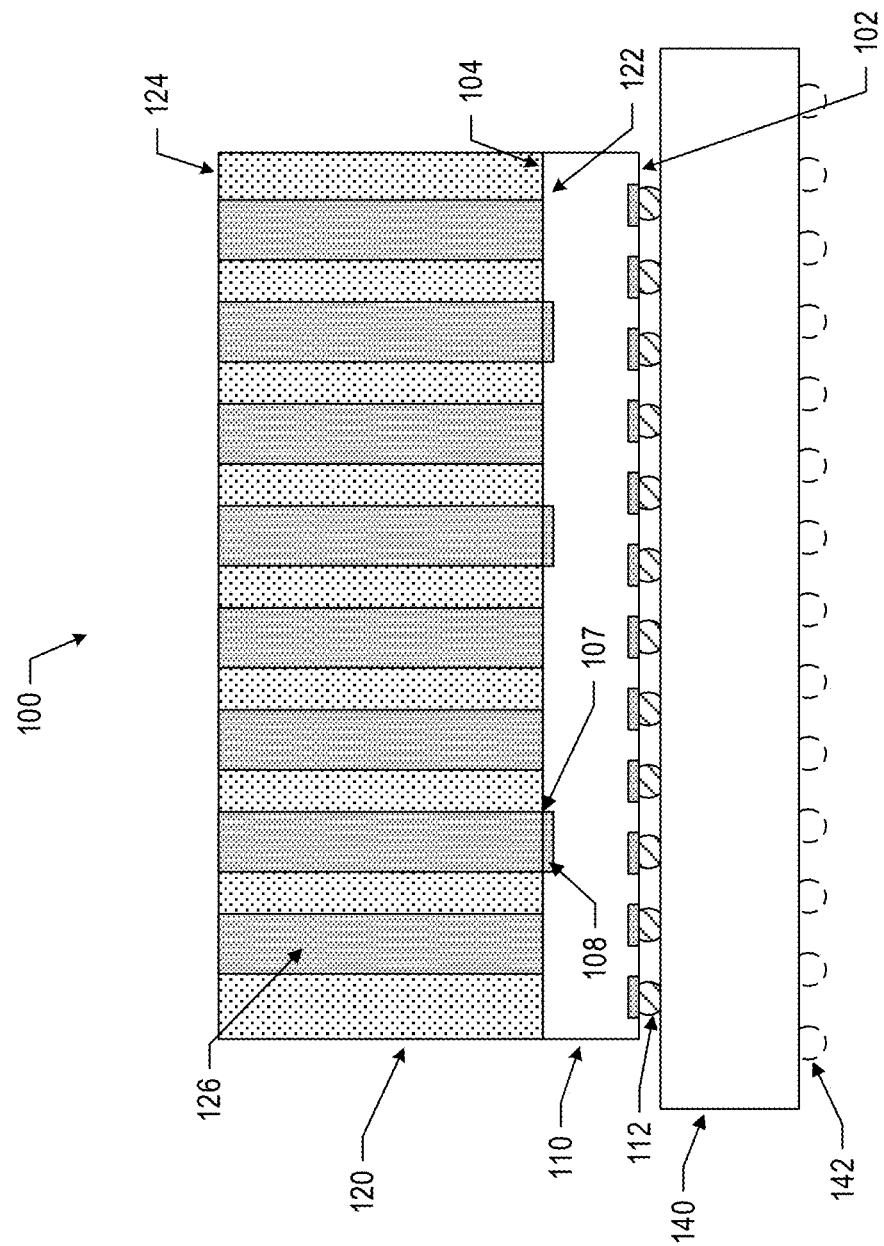
FIGS. 4-6 are side, cross-sectional views of example microelectronic assemblies, in accordance with various embodiments.
Figure 5:
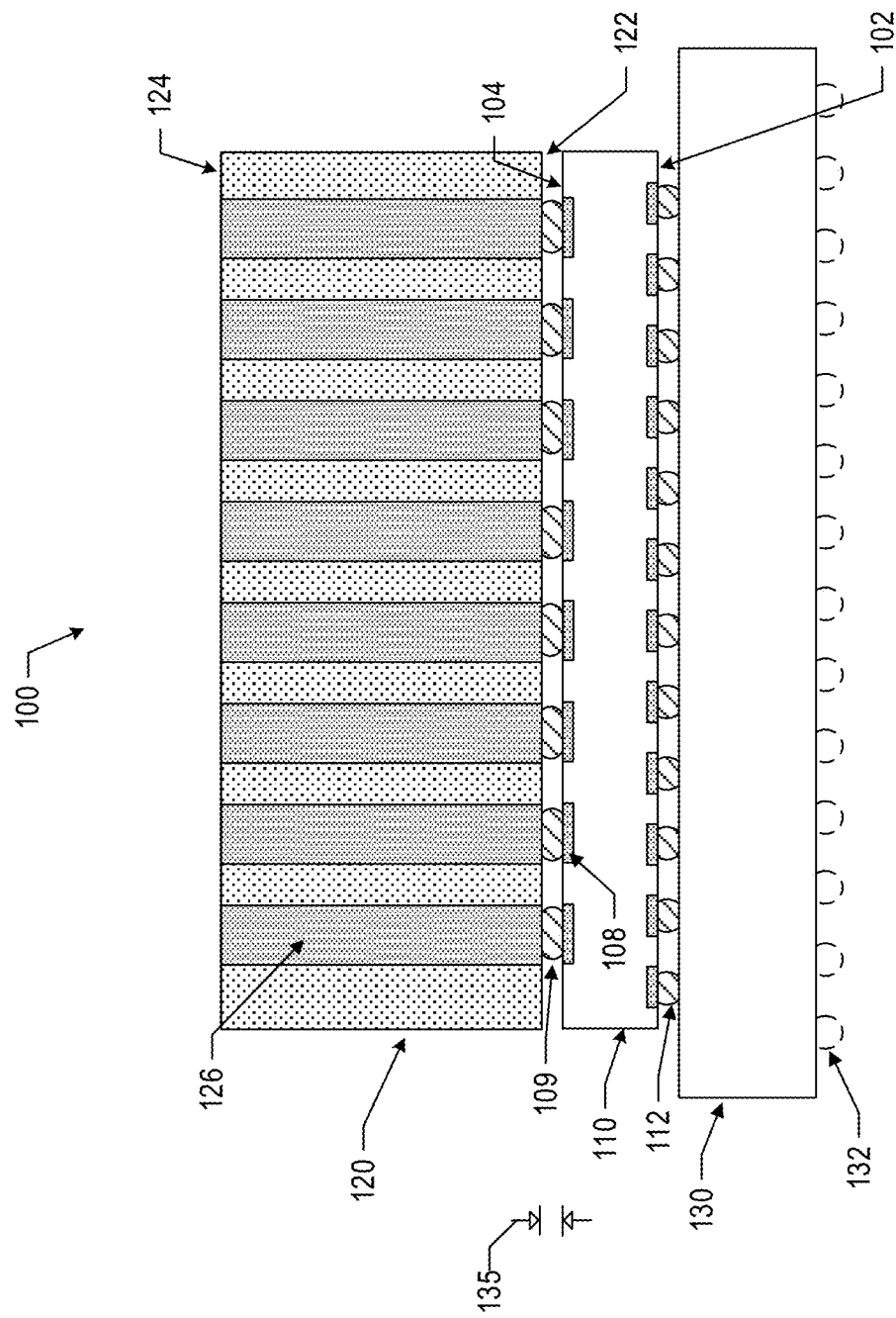

As noted above, in some embodiments, one or more of the conductive pathways 126 of the thermal layer 120 may be electrically connected to one or more electrical devices of the device layer(s) of the die 110. FIGS. 4-5 are side, cross-sectional views of example microelectronic assemblies including electrical interconnects between the thermal layer 120 and the die 110.

FIG. 4 is a side, cross-sectional view of an example microelectronic assembly 100 in which the thermal layer 120 is attached to the die 110 by metal-to-metal interconnects 107. In particular, conductive contacts 108 at the back side 104 of the die 110 may be electrically and mechanically coupled to corresponding conductive pathways 126 at the front side 122 of the thermal layer 120 by metal-to-metal interconnects 107 (e.g., copper-to-copper interconnects, plated interconnects, bumps, pillars, or the like) using any suitable technique (e.g., metal-to-metal attachment techniques, etc.).

FIG. 5 is a side, cross-sectional view of an example microelectronic assembly 100 in which the thermal layer 120 is attached to the die 110 by solder interconnects 109. In particular, conductive contacts 108 at the back side 104 of the die 110 may be electrically and mechanically coupled to corresponding conductive pathways 126 at the front side 122 of the thermal layer 120 by solder interconnects 109 using any suitable technique. In some embodiments, the solder interconnects 109 may include a solder with a higher melting point than solder included in some or all of the first-level interconnects 112. For example, when the solder interconnects 109 in a microelectronic assembly 100 are formed before the first-level interconnects 112 are formed, solder interconnects 109 may utilize a higher melting temperature solder, while the first-level interconnects 112 may utilize a lower melting temperature solder.

In various embodiments, interconnects 107 or 109 may vary in distance 135 ranging from the sub-ten microns to the low tens of microns. The distance 135 may extend between the back side 104 of the die 110 and the front side 122 of the thermal layer 120. For embodiments in which metal-to-metal interconnects 109 are used (e.g., direct bonding or hybrid bonding), the distance 135 may range from 2 microns to 40 microns or less. For embodiments in which solder interconnects 107 are used, the distance 135 may range between 20 microns and 100 microns.

Figure 6:
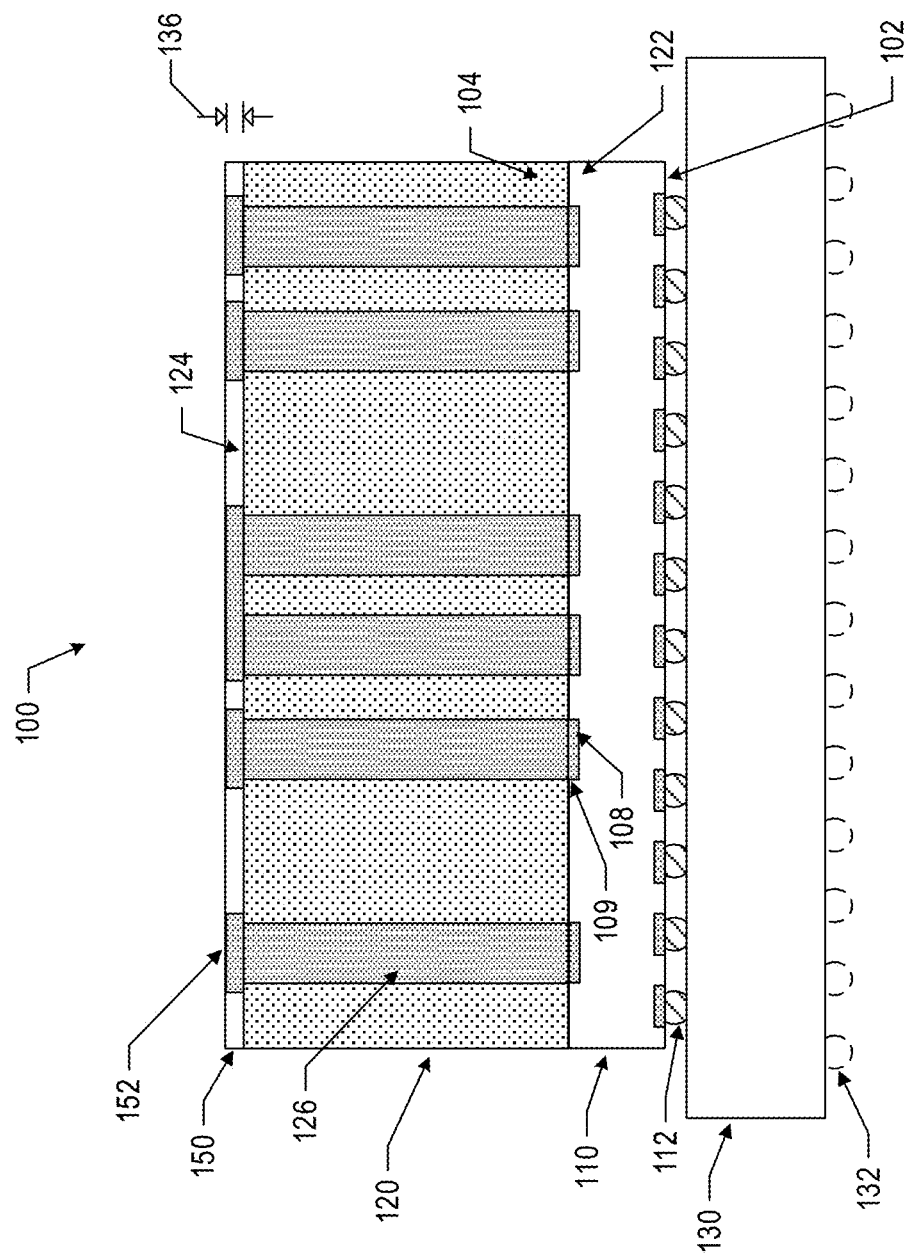

Some microelectronic assemblies 100 may include interconnect layer(s) and/or electrical devices that may be formed on the back side of the thermal layer 120. FIG. 6 is a side, cross-sectional view of an example microelectronic assembly 100 including an interconnect layer 150 formed on the back side 124 of the thermal layer 120. The interconnect layer 150 may include one or more interconnect structures 152. The interconnect layer 150 may have a thickness 136, which may range between 1 micron and 30 microns and may be dependent on the number of interconnect layers 150 formed on the back side 124 of the thermal layer 120. Although only one interconnect layer 150 is illustrated for the embodiment of FIG. 6, it is to be understood that any number if interconnect layers 150 may be formed on the back side 124 of the thermal layer 120.

In some instances, the interconnect layer 150 may also be referred to as a routing layer, a back side routing layer, or a redistribution layer (RDL). The interconnect layer 150 may include an insulating material (e.g., a dielectric material formed in one or more layers, as known in the art) and one or more conductive pathways, referred to herein as interconnect structures 152, through the dielectric material (e.g., including conductive traces and/or conductive vias). In some embodiments, the insulating material of the interconnect layer 150 may be composed of dielectric materials, BT resin, polyimide materials, epoxy materials (e.g., glass reinforced epoxy matrix materials, epoxy build-up films, or the like), mold materials, oxide-based materials (e.g., silicon dioxide or spin on oxide), or low-k and ultra low-k dielectric (e.g., carbon-doped dielectrics, fluorine-doped dielectrics, porous dielectrics, and organic polymeric dielectrics).

In some embodiments, the interconnect layer 150, via interconnect structures 152, may provide for the ability to provide fan-in die-to-die interconnects (FIG. 9) or provide other die-to-die interconnects for stacking additional dies within the microelectronic assembly. In some embodiments, dies may be directly interconnected with one or more conductive pathways 126 of the thermal layer 120 without interconnect layer(s) 150 being formed on the back side 124 of the thermal layer 120. In some embodiments, the interconnect structures 152 and/or the conductive pathways 126 may have larger widths to provide lower direct current (DC) and/or RF losses in the metallization, which may improve the performance of different applications and/or implementations.

Figure 7A:
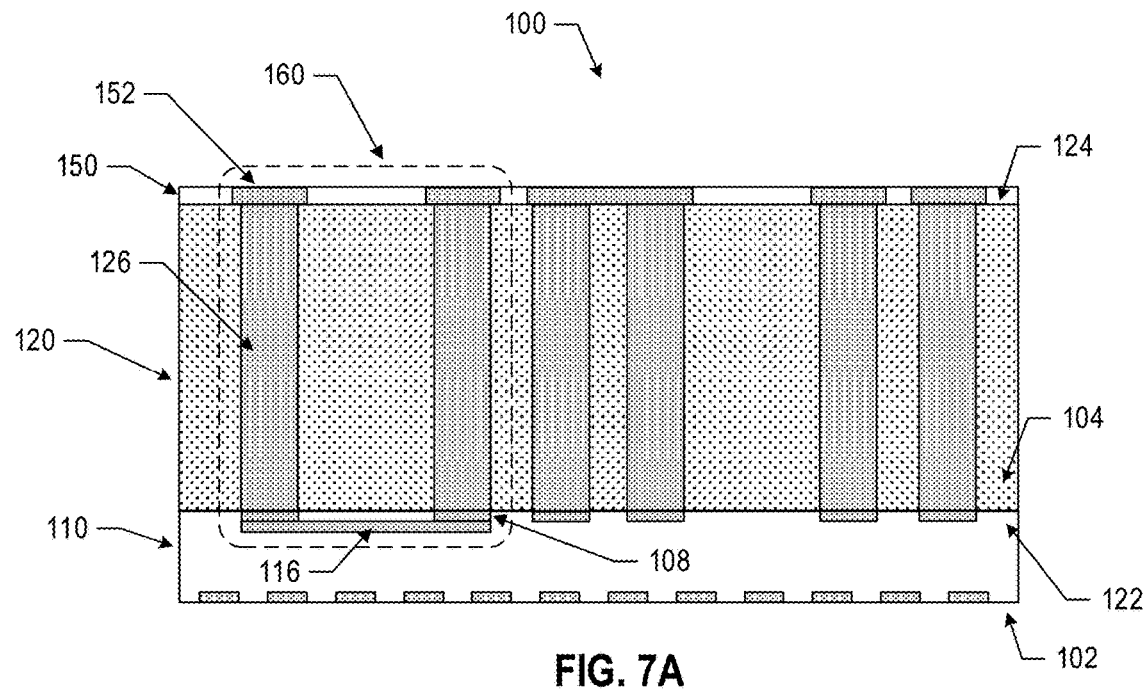
FIG. 7A is a side, cross-sectional view of another example microelectronic assembly, in accordance with various embodiments.
Figure 7B:
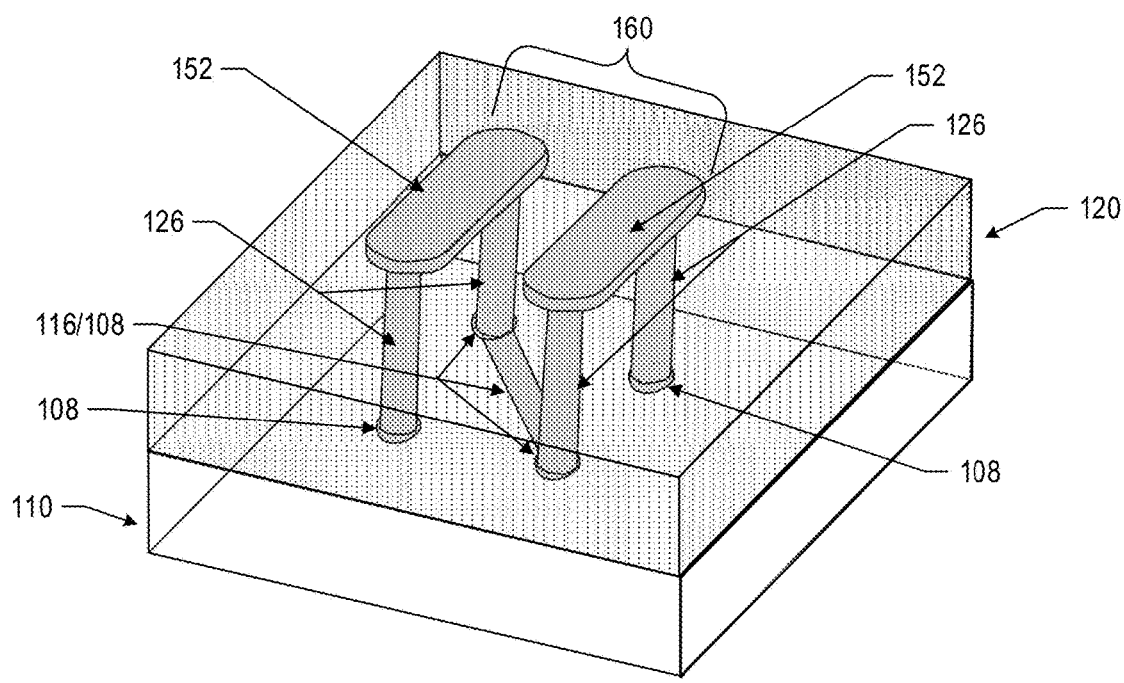
FIG. 7B is an orthographic view of an example electronic device of the microelectronic assembly of FIG. 7A, in accordance with various embodiments.

In some embodiments, electrical devices (e.g., inductors, antennas, transformers, etc.) may be formed using interconnect structures 152 of the interconnect layer. FIG. 7A is a side, cross-sectional view of an example microelectronic assembly 100 in which an inductor 160 (e.g., a power delivery inductor or a high Q-factor RF inductor) may be formed using interconnect structures 152 of the interconnect layer 150. FIG. 7B is an orthogonal view of a portion of the thermal layer 120 and a portion the die 110 for the microelectronic assembly 100 of FIG. 7A in which the inductor 160 is formed.

As illustrated in FIGS. 7A-7B, the interconnect structures 152 may be used to interconnect adjacent conductive pathways 126 at the back side 124 of the thermal layer 120 to form adjacent portions of the inductor 160 and an interconnect structure 116 (e.g., a conductive line) within the die 110 may be used to electrically interconnect the adjacent portions to form the inductor 160. It is to be understood that the inductor 160 and interconnections used to form the inductor 160 illustrated in FIGS. 7A-7B are provided for illustrative purposes only and are not meant to limit the broad scope of the present disclosure.

Figure 8A:
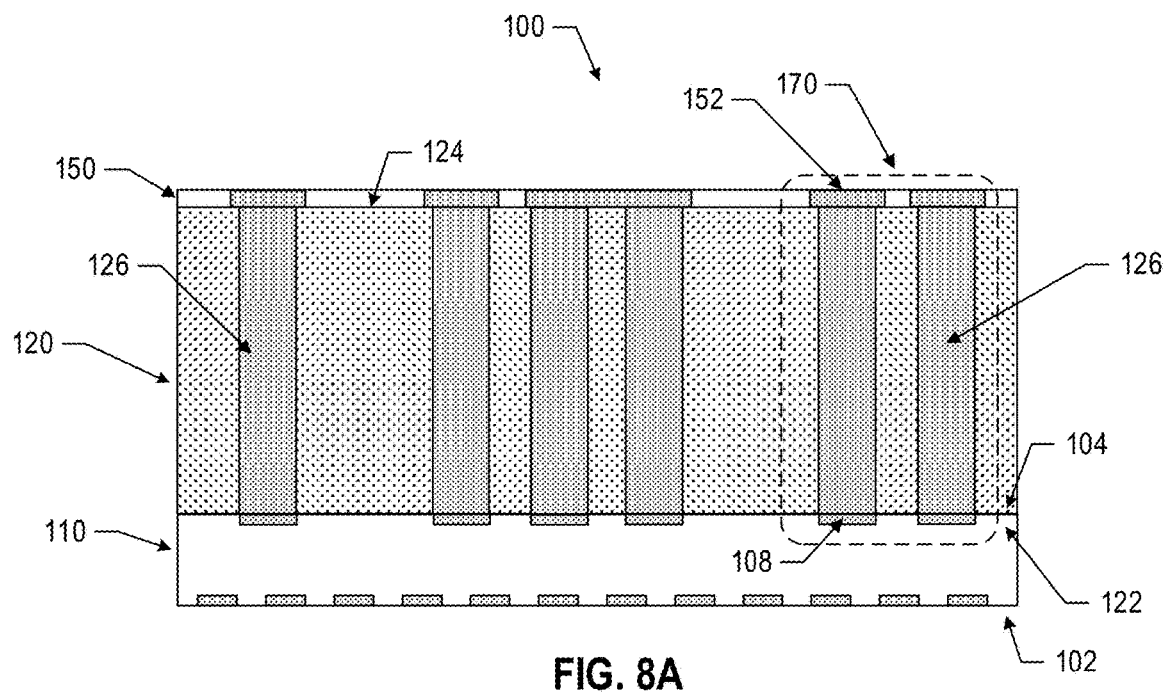
FIG. 8A is a side, cross-sectional view of another example microelectronic assembly, in accordance with various embodiments.
Figure 8B:
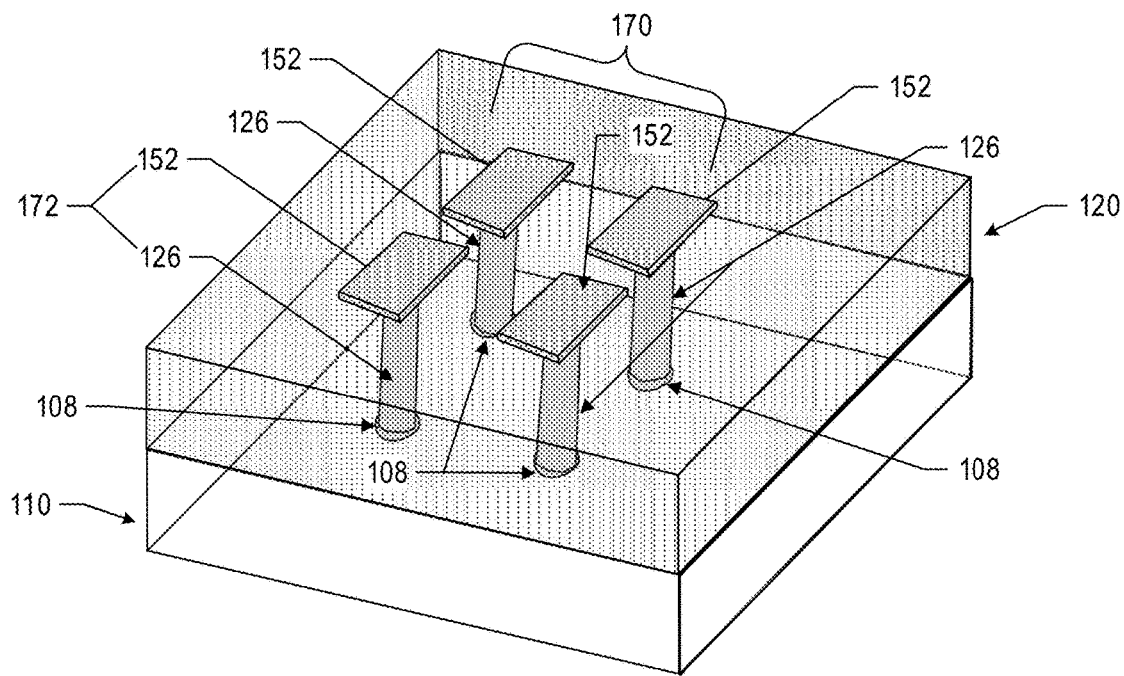
FIG. 8B is an orthographic view of an example electronic device of the microelectronic assembly of FIG. 8A in accordance with various embodiments.

FIG. 8A is a side, cross-sectional view of an example microelectronic assembly 100 in which an array 170 of antennas 172 may be formed using interconnect structures 152 of the interconnect layer 150. FIG. 8B is an orthogonal view of a portion of the thermal layer 120 and a portion the die 110 for the microelectronic assembly 100 of FIG. 7A in which the antenna array 170 is formed. As illustrated in FIG. 7B, an antenna 172 may be composed of a conductive pathway 126 of the thermal layer 120 and a corresponding interconnect structure 152 coupled to the conductive pathway 126. In various embodiments, the antennas 172 may be high frequency antennas (e.g., gigahertz (GHz), terahertz (THz), etc.) and/or low frequency antennas. It is to be understood that the antenna array 170 and antennas illustrated in FIGS. 8A-8B are provided for illustrative purposes only and are not meant to limit the broad scope of the present disclosure.

Figure 9:
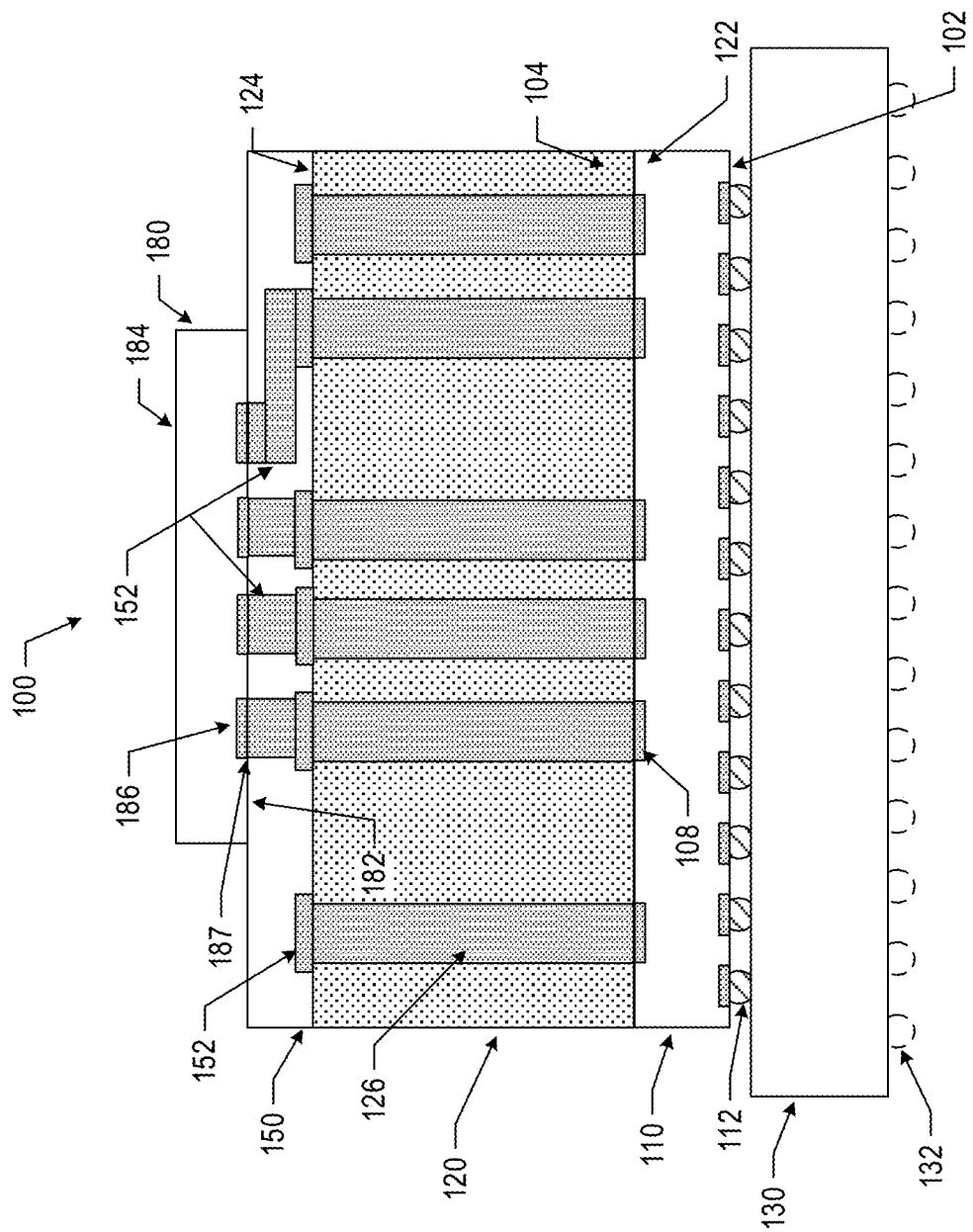
FIG. 9 is a side, cross-sectional view of another example microelectronic assembly, in accordance with various embodiments.

FIG. 9 is a side, cross-sectional view of an example microelectronic assembly 100 in which another die 180 is attached to the back side 124 of the thermal layer 120 using interconnect structures 152 of the interconnect layer 150. For the embodiment of FIG. 9, the interconnect layer 150 may include multiple layers and corresponding interconnect structure 152 formed using any suitable technique. The die 180 may have a front side 182 an opposing back side 184. Conductive contacts 186 at the front side 182 of the die 180 may be electrically and mechanically coupled to interconnect structures 152 of the interconnect layer 150 by interconnects 187. For the embodiment of FIG. 9, metal-to-metal interconnects are illustrated; however, it is to be understood that any interconnects may be formed using any suitable technique, as discussed herein. Accordingly, the microelectronic assembly 100 of the embodiment of FIG. 9 illustrates an assembly in which another die 180 may be stacked on the die 110 via the thermal layer 120 and the interconnect layer 150. In some embodiments, however, other dies may be stacked on the die 110 without use of the interconnect layer 150.

Any suitable techniques may be used to manufacture the microelectronic assemblies disclosed herein. For example, FIGS. 10A-10D are side, cross-sectional views of various stages in an example process for manufacturing the microelectronic assembly of FIG. 1, in accordance with various embodiments. Although the operations discussed below with FIGS. 10A-10D (and others of the accompanying drawings representing manufacturing processes) are illustrated in a particular order, these operations may be performed in any suitable order. Additionally, although particular assemblies are illustrated in FIGS. 10A-10D (and others of the accompanying drawings representing manufacturing processes), the operations discussed below with reference to FIGS. 10A-10D may be used to form any suitable assemblies. In some embodiments, microelectronic assemblies manufactured in accordance with the process of FIGS. 10A-10D (e.g., any of the microelectronic assemblies of FIGS. 4-5) may include interconnects, which may include solder or non-solder interconnects (e.g., metal-to-metal interconnects or anisotropic conductive material interconnects) between the die 110 and the thermal layer 120 and may be formed using any suitable technique, as discussed herein.

In some embodiments of FIGS. 10A-10D, the die 110 and the thermal layer 120 may first be assembled into a "composite die," and then the composite die may be coupled to the package substrate 140; however, in other embodiments, the die 110 and the thermal layer 120 may not be assembled into a "composite die." In general, a composite die may refer to a semiconductor structure in which multiple dies may be coupled together and assembled such that the assembly can be treated as a single die. In particular, the assembly may have a planar surface with conductive contacts for first-level interconnects. This approach may allow for tighter tolerances in the formation of interconnects, and may be particularly desirable for integrating relatively small dies into a composite die assembly.

FIG. 10A illustrates a thermal layer 1020 having a front side 1022 and an opposing back side 1024. The thermal layer 1020 may have a thickness 1033. The thermal layer 1020 may take the form of any of the thermal layers discussed herein with reference to the thermal layer 120. For example, the thermal layer 1020 may be composed of a material as discussed herein.

FIG. 10B illustrates an assembly 1100 subsequent to forming conductive pathways 1026 extending between the front side 1022 and the back side 1024 of the thermal layer 1020. The conductive pathways 1026 may be formed using any suitable technique. For example, in some embodiments, the conductive pathways 1026 may be formed by laser drilling, mechanical drilling, or plasma etching the thermal layer 1020 and filling the corresponding voids in the thermal layer 1020 with a conductive material such as copper. In some embodiments, any suitable vertical conductive pathway formation technique may be used to form the conductive pathways 1026. The conductive pathways 1026 may have a width 1030 and may be separated by a spacing distance 1031 between adjacent ones of the conductive pathways 1026.

FIG. 10C illustrates an assembly 1102 subsequent to attaching the thermal layer 1020 to a die 1010. The die 1010 may take the form of any of the dies discussed herein with reference to the die 1010. For example, the die 1010 may have a front side 1002 and an opposing back side 1004 and be composed of a semiconductor material. The die 1010 may have a thickness 1032. In some embodiments, the semiconductor material of the die 1010 may be different than the material of the thermal layer 1020; however, in other embodiments, the semiconductor material of the die 1010 may be the same as the material of the thermal layer 1020. The die 1010 may include conductive contacts 1006 at the front side 1002 of the die 1010. In some embodiments, the die 1010 may also include one or more conductive contacts 1008 at the back side 1004 of the die 1010, which may be used to provide electrical connections between one or more of the conductive pathways and electrical devices of the device layer(s) of the die 1010. Although die-to-die bonding is illustrated in the embodiment of FIG. 10C, it is to be understood that wafer level bonding between two wafers may also be performed, in accordance with various embodiments.

The thermal layer 1020 may be attached to the die 1010 using any suitable technique, as discussed herein (e.g., direct bonding, hybrid bonding, metal-to-metal attachment, solder attachment, adhesive, etc.). The attaching may include wafer-to-wafer bonding, die-to-wafer bonding, or die-to-die bonding in various embodiments. In some embodiments, the attaching may include forming electrical interconnects between one or more conductive pathways 1026 at the front side 1022 of the thermal layer 1020 and corresponding ones of the conductive contacts 1008 that may be present at the back side 1004 of the die 1010. In other embodiments, electrical interconnects may not be formed between one or more of the conductive pathways 1026 of the thermal layer 1020 and the die 1010.

Figure 10D:
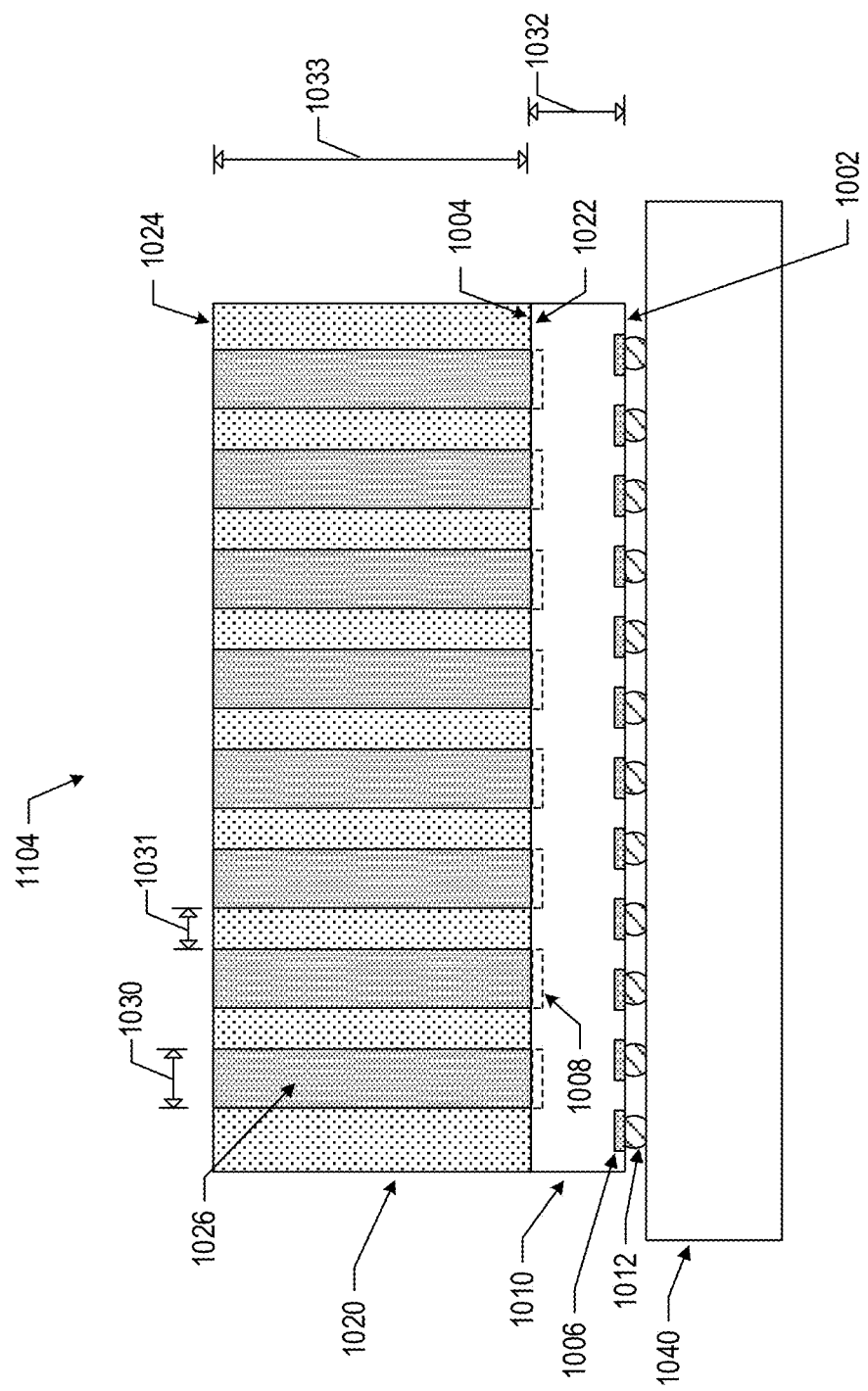

FIG. 10D illustrates an assembly 1104 subsequent to coupling the assembly 1102 to a package substrate 1040 using first-level interconnects 1012. The package substrate 1040 may to take the form of any of the package substrates discussed herein with reference to package substrate 140. The first-level interconnects 1012 may take any of the forms disclosed herein (e.g., solder interconnects or anisotropic conductive material interconnects), and any suitable techniques may be used to form the first-level interconnects 1012 (e.g., a mass reflow process or a thermal compression bonding process). The assembly 1104 may take the form the microelectronic assembly 100 of FIG. 1.

Figure 11A:
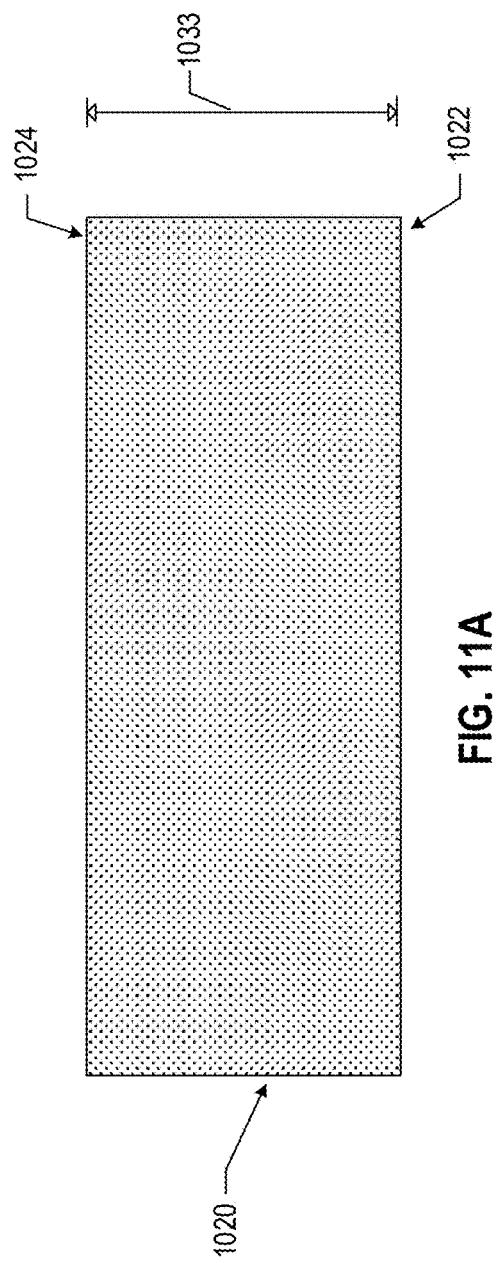
FIGS. 11A-11E are side, cross-sectional views of various stages in another example process for manufacturing another microelectronic assembly, in accordance with various embodiments.

FIGS. 11A-11E are side, cross-sectional views of various stages in another example process for manufacturing another microelectronic assembly, in accordance with various embodiments. FIG. 11A illustrates the thermal layer 1020 having a front side 1022 and an opposing back side 1024. The thermal layer 1020 may have a thickness 1033.

Figure 11B:
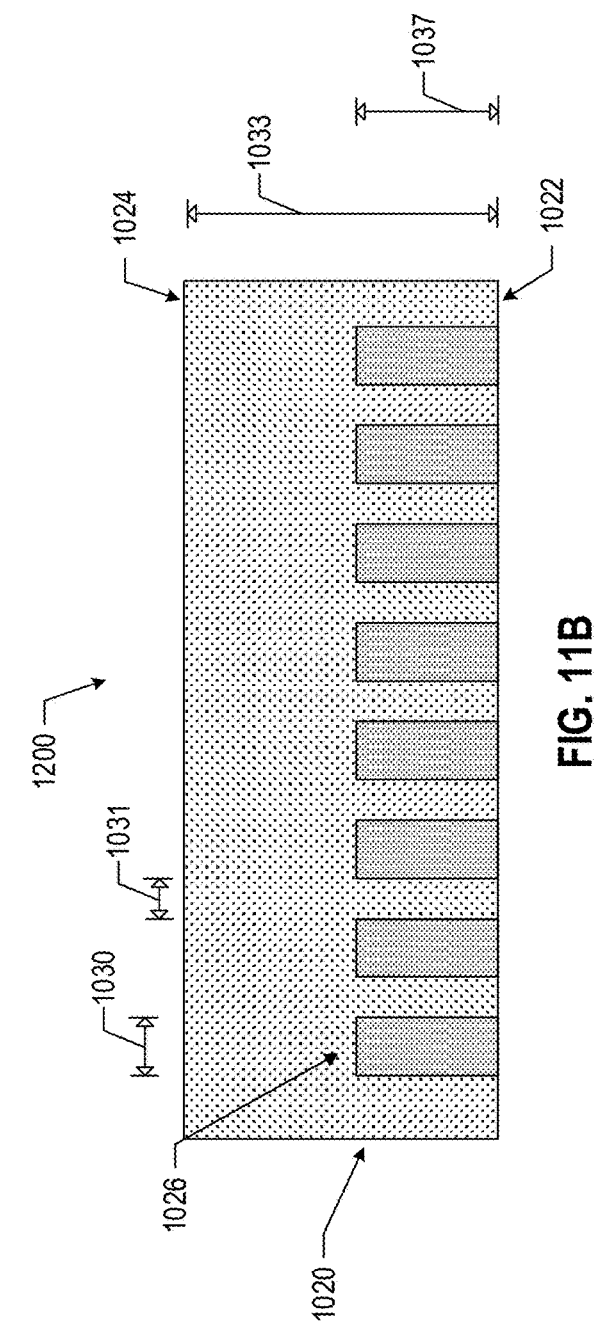

FIG. 11B illustrates an assembly 1200 subsequent to forming conductive pathways 1026 in the thermal layer 1020. The conductive pathways 1026 shown in FIG. 10B may be formed to a distance 1037 that is less than the thickness 1033 of the thermal layer 1020. The conductive pathways may be formed using any suitable technique, as discussed herein. The conductive pathways 1026 may have a width 1030 and may be separated by a spacing distance 1031 between adjacent ones of the conductive pathways 1026.

Figure 11C:
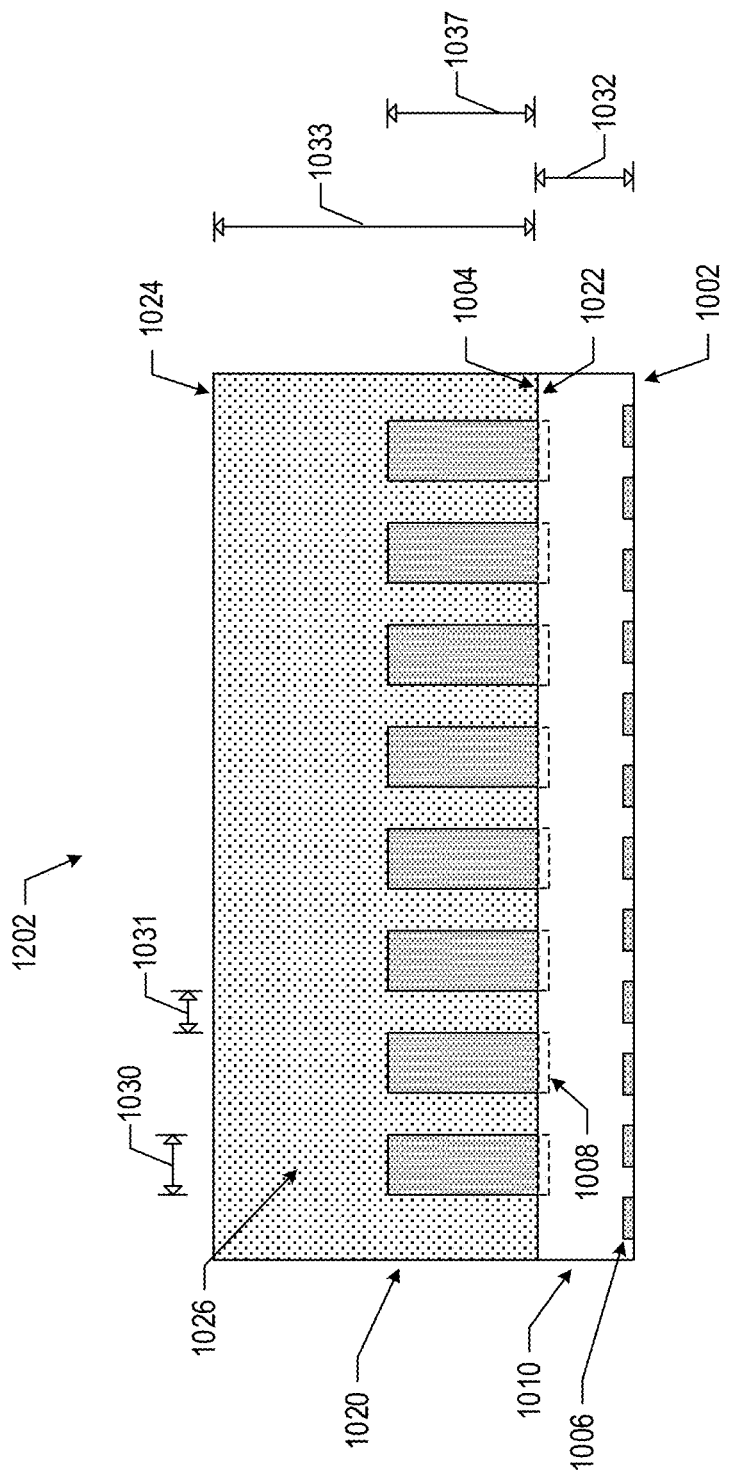

FIG. 11C illustrates an assembly 1202 subsequent to attaching the thermal layer 1020 to the die 1010. The die 1010 may have a front side 1002 and an opposing back side 1004 and be composed of a semiconductor material. The die 1010 may have a thickness 1032. In some embodiments, the semiconductor material of the die 1010 may be different than the material of the thermal layer 1020; however, in other embodiments, the semiconductor material of the die 1010 may be the same as the material of the thermal layer 1020. The die 1010 may include conductive contacts 1006 at the front side 1002 of the die 1010. In some embodiments, the die 1010 may also include one or more conductive contacts 1008 at the back side 1004 of the die 1010, which may be used to provide electrical connections between one or more of the conductive pathways and electrical devices of the device layer(s) of the die 1010.

The thermal layer 1020 may be attached to the die 1010 using any suitable technique, as discussed herein. The attaching may include wafer-to-wafer bonding, die-to-wafer bonding, or die-to-die bonding in various embodiments. In some embodiments, the attaching may include forming electrical interconnects between one or more conductive pathways 1026 at the front side 1022 of the thermal layer 1020 and corresponding ones of the conductive contacts 1008 that may be present at the back side 1004 of the die 1010. In other embodiments, electrical interconnects may not be formed between one or more of the conductive pathways 1026 of the thermal layer 1020 and the die 1010.

Figure 11D:
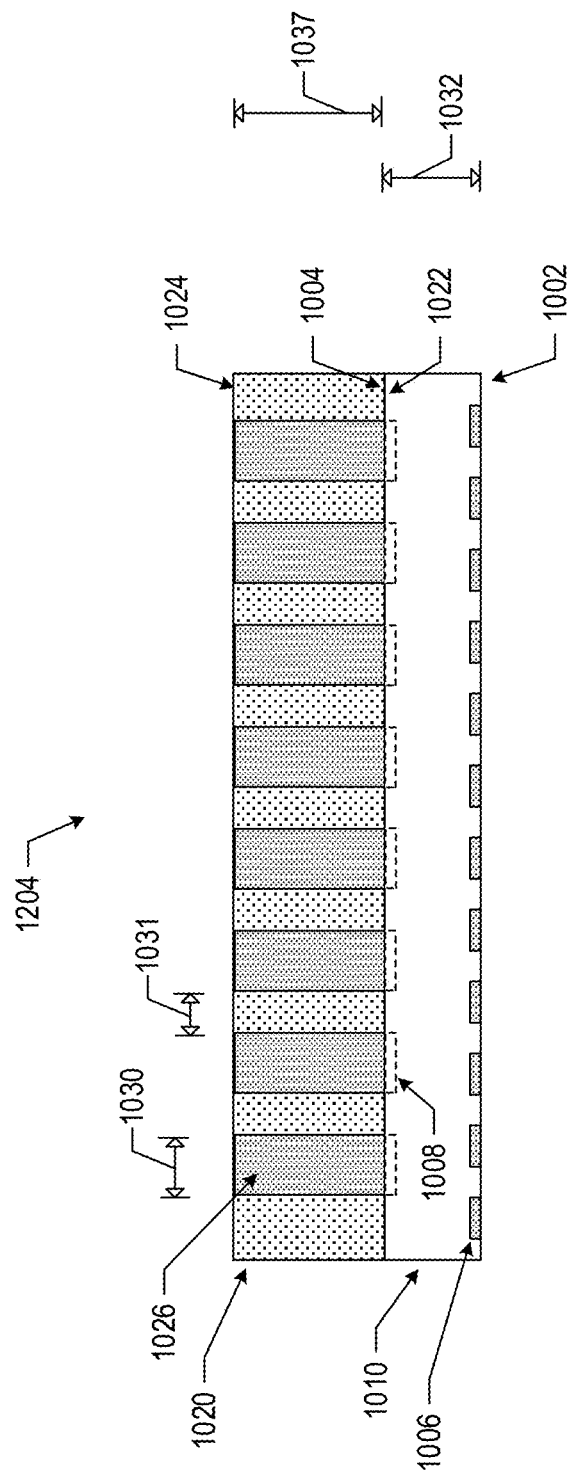

FIG. 11D illustrates an assembly 1204 subsequent to removing a portion of the thermal layer 1020 to expose the conductive pathways 1026 at the (new) back side 1024 of the thermal layer 1020. The removing may be performed using any suitable technique, such as grinding or otherwise planarizing the thermal layer 1020 to expose the conductive pathways 1026. Following the removing, the thermal layer 1020 may have a new thickness equal to the distance 1037 and the conductive pathways 1026 may extend between the front side 1022 and the back side 1024 of the thermal layer 1020.

Figure 11E:
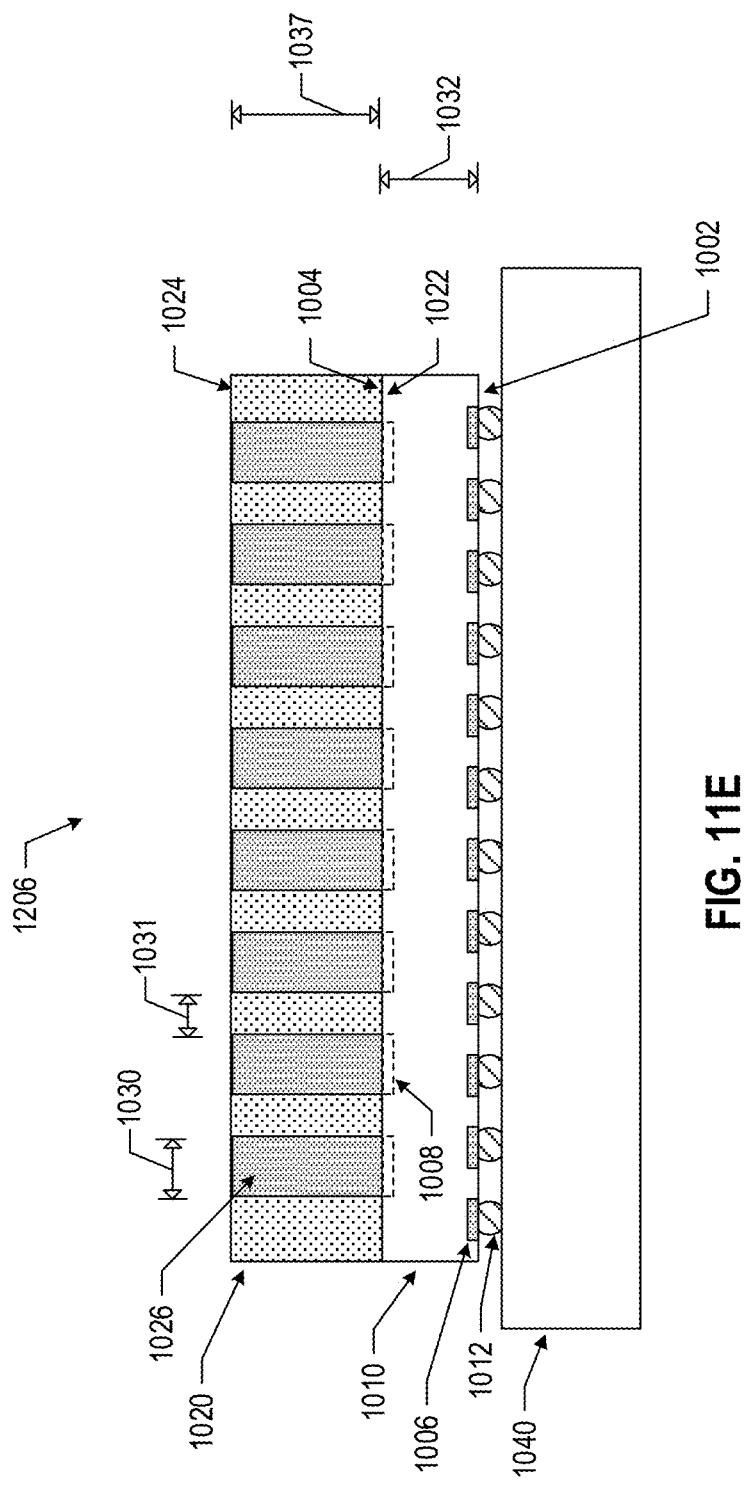

FIG. 11E illustrates an assembly 1206 subsequent to coupling the assembly 1204 to the package substrate 1040 using first-level interconnects 1012. The first-level interconnects 1012 may take any of the forms disclosed herein, and any suitable techniques may be used to form the first-level interconnects 1012.

Figure 12B:
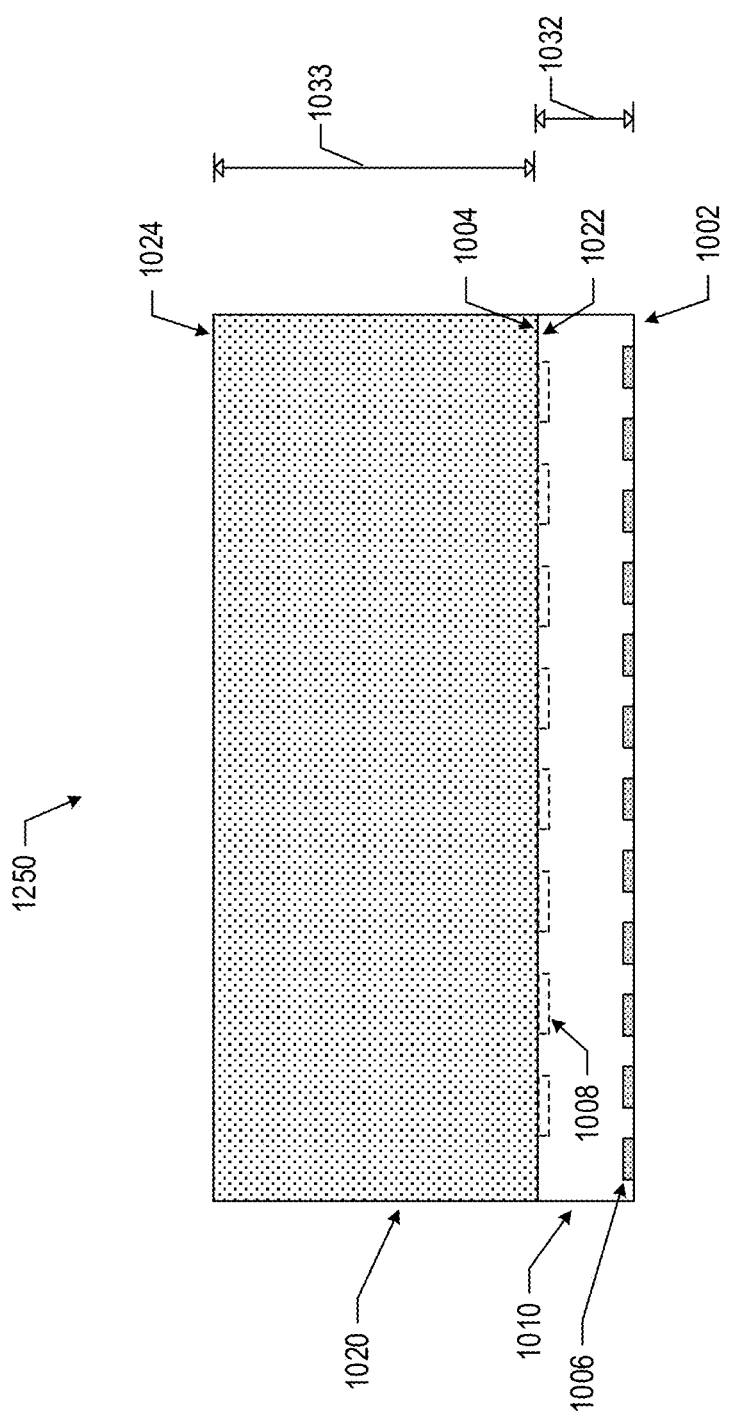

FIGS. 12A-12D are side, cross-sectional views of various stages in another example process for manufacturing the microelectronic assembly of FIG. 1, in accordance with various embodiments. In particular, FIGS. 12A-12D illustrate an example process in which conductive pathways 1026 of the thermal layer 1020 may be formed subsequent to attaching the thermal layer 1020 to the die 1010. FIG. 12A illustrates the thermal layer 1020 having a front side 1022 and an opposing back side 1024. The thermal layer 1020 may have a thickness 1033.

FIG. 12B illustrates an assembly 1250 subsequent to attaching the thermal layer 1020 to the die 1010. As illustrated in FIG. 12B, no conductive pathways may be formed in the thermal layer 1020 prior to the attaching. The thermal layer 1020 may be attached to the die 1010 using any suitable technique, as discussed herein. The attaching may include wafer-to-wafer bonding, die-to-wafer bonding, or die-to-die bonding in various embodiments. As there may be no conductive pathways formed in the thermal layer 1020 prior to the attaching, no electrical interconnects may be formed between the thermal layer 1020 and the die 1010 for the assembly 1250. The die 1010 may have a front side 1002 and an opposing back side 1004 and be composed of a semiconductor material. The die 1010 may have a thickness 1032. In some embodiments, the semiconductor material of the die 1010 may be different than the material of the thermal layer 1020; however, in other embodiments, the semiconductor material of the die 1010 may be the same as the material of the thermal layer 1020. The die 1010 may include conductive contacts 1006 at the front side 1002 of the die 1010. In some embodiments, the die 1010 may also include one or more conductive contacts 1008 at the back side 1004 of the die 1010.

Figure 12C:
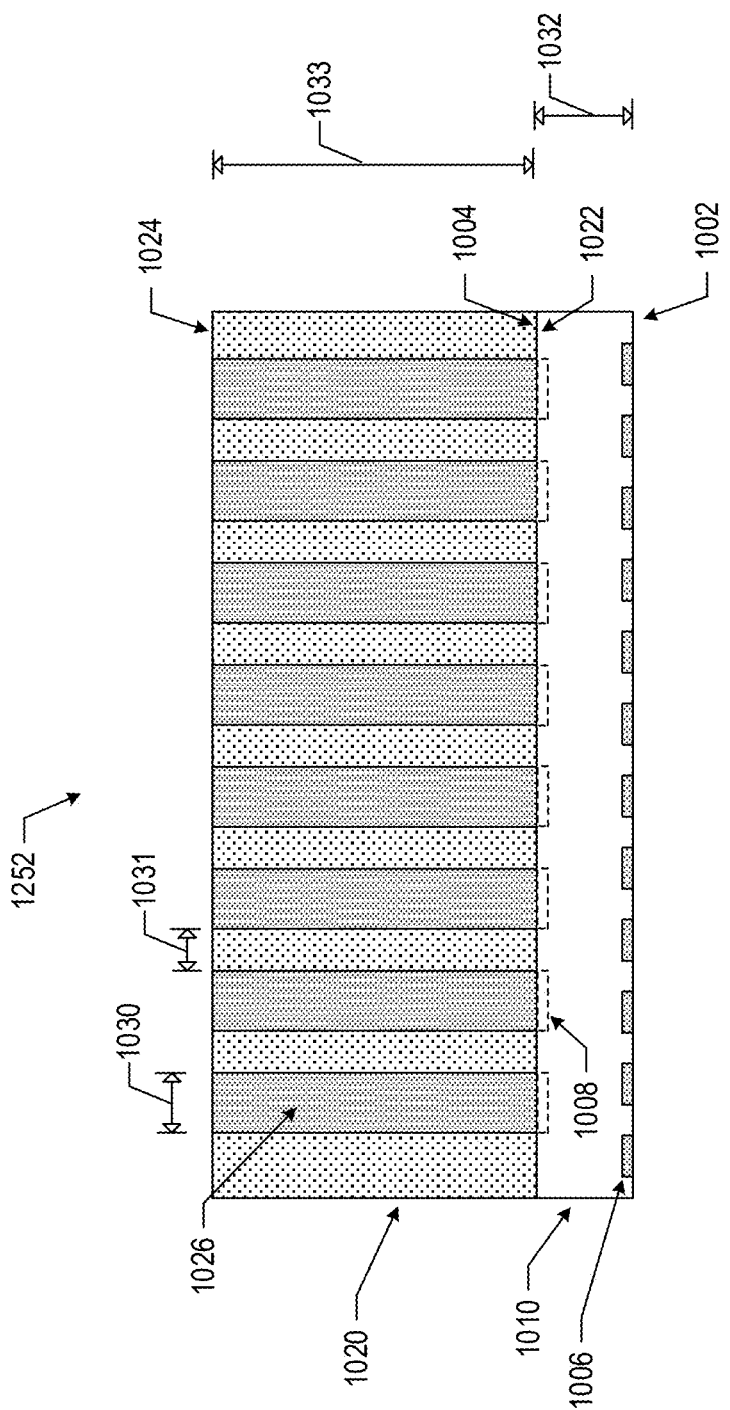

FIG. 12C illustrates an assembly 1252 subsequent to forming the conductive pathways 1026 extending between the front side 1022 and the back side 1024 of the thermal layer 1020. The conductive pathways 1026 may be formed using any suitable technique. The conductive pathways 1026 may have a width 1030 and may be separated by a spacing distance 1031 between adjacent ones of the conductive pathways 1026.

Figure 12D:
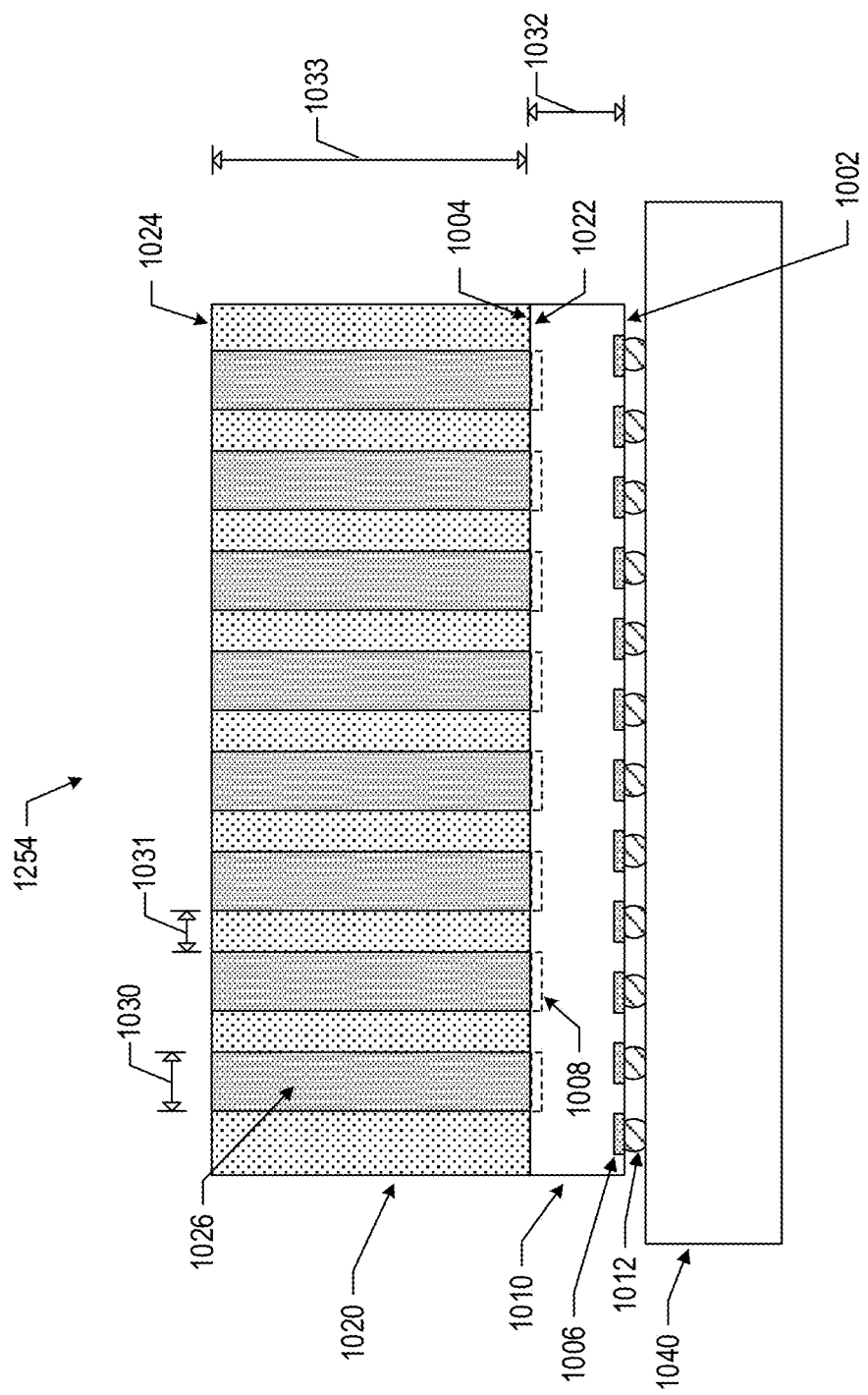

FIG. 12D illustrates an assembly 1254 subsequent to coupling the assembly 1252 to the package substrate 1040 using first-level interconnects 1012. The first-level interconnects 1012 may take any of the forms disclosed herein, and any suitable techniques may be used to form the first-level interconnects 1012. The assembly 1254 may take the form the microelectronic assembly 100 of FIG. 1.

The microelectronic assemblies disclosed herein may be used for any suitable application. For example, in some embodiments, a microelectronic assembly 100 may be used to provide an ultra-high density and high bandwidth interconnect for field programmable gate array (FPGA) transceivers (or other transceivers) between the transceivers and RF devices, power delivery devices, and/or other devices that may be interconnected at the back side 124 of the thermal layer 120. Such applications may be particularly suitable for military electronics, 5G wireless communications, WiGig communications, and/or millimeter wave communications.

More generally, the microelectronic assemblies 100 disclosed herein may allow "blocks" of different kinds of functional circuits to be distributed into different ones of the dies 110/180, instead of having all of the circuits included in a single large die, per some conventional approaches. In some such conventional approaches, a single large die would include all of these different circuits to achieve high bandwidth, low loss communication between the circuits, and some or all of these circuits may be selectively disabled to adjust the capabilities of the large die. However, because the conductive pathways 126 of the microelectronic assemblies 100 may allow high bandwidth, low loss communications, power delivery, etc., different circuits may be distributed into different dies 110/180, reducing the total cost of manufacture, improving yield, and increasing design flexibility by allowing different dies 110/180 (e.g., dies 110/180 formed using different fabrication technologies) to be readily swapped to achieve different functionality.

In another example, the die 110 in a microelectronic assembly 100 may be a processing device (e.g., a central processing unit, a graphics processing unit, a FPGA, a modem, an applications processor, etc.), and electrical devices (e.g., RF, power delivery, etc.) may be formed on the back side 124 of the thermal layer 120. In another example, the die 110 in a microelectronic assembly 100 may be a cache memory (e.g., a third level cache memory), and one or more dies 180 may be processing devices (e.g., a central processing unit, a graphics processing unit, a FPGA, a modem, an applications processor, etc.) that share the cache memory of the die 110.

The microelectronic assemblies 100 disclosed herein may be included in any suitable electronic component. FIGS. 13-17 illustrate various examples of apparatuses that may include, or be included in, any of the microelectronic assemblies 100 disclosed herein.

Figure 13:
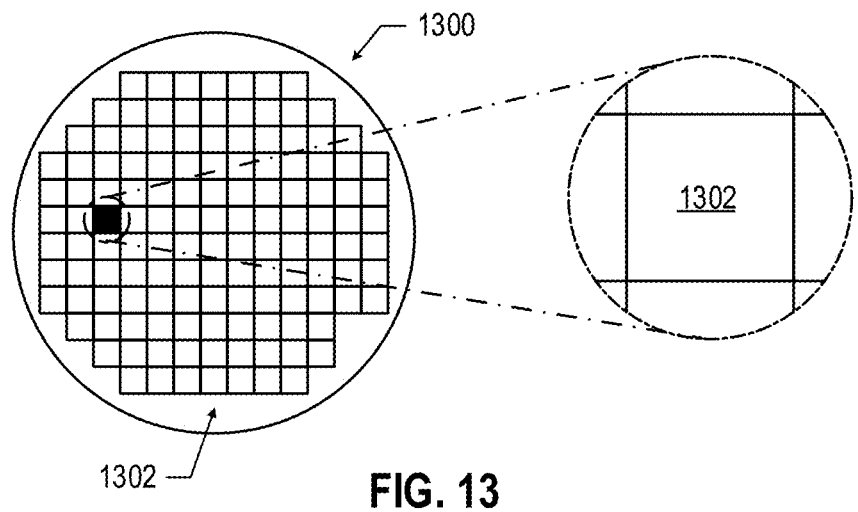
FIG. 13 is a top view of a wafer and dies that may include a microelectronic assembly, in accordance with any of the embodiments disclosed herein.

FIG. 13 is a top view of a wafer 1300 and dies 1302 that may be included in any of the microelectronic assemblies 100 disclosed herein (e.g., as any suitable ones of the dies 110/180 and/or the thermal layer 120). The wafer 1300 may be composed of semiconductor material and may include one or more dies 1302 having IC structures formed on a surface of the wafer 1300. Each of the dies 1302 may be a repeating unit of a semiconductor product that includes any suitable IC. After the fabrication of the semiconductor product is complete, the wafer 1300 may undergo a singulation process in which the dies 1302 are separated from one another to provide discrete "chips" of the semiconductor product. The die 1302 may be any of the dies 110/180 and/or the thermal layer 120 disclosed herein. In some embodiments, the die 1302 may include one or more transistors (e.g., some of the transistors 1440 of FIG. 14, discussed below), supporting circuitry to route electrical signals to the transistors, passive components (e.g., signal traces, resistors, capacitors, or inductors), and/or any other IC components. In some embodiments, the wafer 1300 or the die 1302 may include a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 1302. For example, a memory array formed by multiple memory devices may be formed on a same die 1302 as a processing device (e.g., the processing device 1702 of FIG. 17) or other logic that is configured to store information in the memory devices or execute instructions stored in the memory array. Various ones of the microelectronic assemblies 100 disclosed herein may be manufactured using a die-to-wafer assembly technique in which some dies 110/180 are attached to a wafer 1300 that include others of the dies 110/180, and the wafer 1300 is subsequently singulated.

Figure 14:
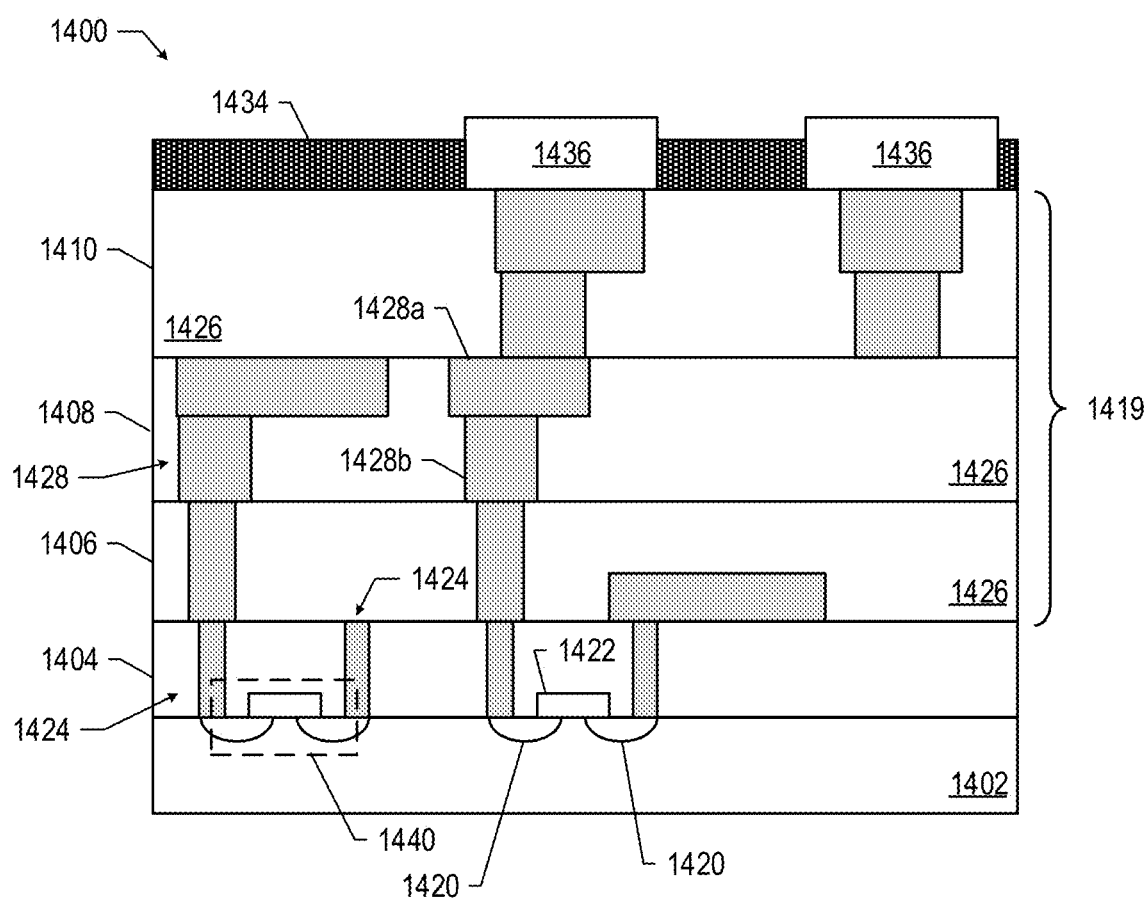
FIG. 14 is a cross-sectional side view of an integrated circuit (IC) device that may be included in a microelectronic assembly, in accordance with any of the embodiments disclosed herein.

FIG. 14 is a cross-sectional side view of an example IC device 1400 that may be included in any of the microelectronic assemblies 100 disclosed herein (e.g., in any of the dies 110/180). One or more of the IC devices 1400 may be included in one or more dies 1302 (FIG. 13). The IC device 1400 may be formed on a substrate 1402 (e.g., the wafer 1300 of FIG. 13) and may be included in a die (e.g., the die 1302 of FIG. 13). The substrate 1402 may be a semiconductor substrate composed of semiconductor material systems including, for example, n-type or p-type materials systems (or a combination of both). The substrate 1402 may include, for example, a crystalline substrate formed using a bulk silicon or a SOI substructure. In some embodiments, the substrate 1402 may be formed using alternative materials, which may or may not be combined with silicon, that include but are not limited to germanium, indium antimonide, lead telluride, indium arsenide, indium phosphide, gallium arsenide, or gallium antimonide. Further materials classified as group II-VI, III-V, or IV may also be used to form the substrate 1402. Although a few examples of materials from which the substrate 1402 may be formed are described here, any material that may serve as a foundation for an IC device 1400 may be used. The substrate 1402 may be part of a singulated die (e.g., the dies 1302 of FIG. 13) or a wafer (e.g., the wafer 1300 of FIG. 13).

The IC device 1400 may include one or more device layers 1404 disposed on the substrate 1402. The device layer 1404 may include features of one or more transistors 1440 (e.g., metal oxide semiconductor field-effect transistors (MOSFETs)) formed on the substrate 1402 and/or any other active and/or passive circuitry as may be desired by a device manufacturer. The device layer 1404 may include, for example, one or more source and/or drain (S/D) regions 1420, a gate 1422 to control current flow in the transistors 1440 between the S/D regions 1420, and one or more S/D contacts 1424 to route electrical signals to/from the S/D regions 1420. The transistors 1440 may include additional features not depicted for the sake of clarity, such as device isolation regions, gate contacts, and the like. The transistors 1440 are not limited to the type and configuration depicted in FIG. 14 and may include a wide variety of other types and configurations such as, for example, planar transistors, non-planar transistors, or a combination of both. Non-planar transistors may include FinFET transistors, such as double-gate transistors or tri-gate transistors, and wrap-around or all-around gate transistors, such as nanoribbon and nanowire transistors.

Each transistor 1440 may include a gate 1422 formed of at least two layers, a gate dielectric and a gate electrode. The gate dielectric may include one layer or a stack of layers. The one or more layers may include silicon oxide, silicon dioxide, silicon carbide, and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric to improve its quality when a high-k material is used.

The gate electrode may be formed on the gate dielectric and may include at least one p-type work function metal or n-type work function metal, depending on whether the transistor 1440 is to be a p-type metal oxide semiconductor (PMOS) or an n-type metal oxide semiconductor (NMOS) transistor. In some implementations, the gate electrode may consist of a stack of two or more metal layers, where one or more metal layers are work function metal layers and at least one metal layer is a fill metal layer. Further metal layers may be included for other purposes, such as a barrier layer. For a PMOS transistor, metals that may be used for the gate electrode include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning).

In some embodiments, when viewed as a cross-section of the transistor 1440 along the source-channel-drain direction, the gate electrode may consist of a U-shaped structure that includes a bottom portion substantially parallel to the surface of the substrate and two sidewall portions that are substantially perpendicular to the top surface of the substrate. In other embodiments, at least one of the metal layers that form the gate electrode may simply be a planar layer that is substantially parallel to the top surface of the substrate and does not include sidewall portions substantially perpendicular to the top surface of the substrate. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 1420 may be formed within the substrate 1402 adjacent to the gate 1422 of each transistor 1440. The S/D regions 1420 may be formed using an implantation/diffusion process or an etching/deposition process, for example. In the former process, dopants such as boron, aluminum, antimony, phosphorous, or arsenic may be ion-implanted into the substrate 1402 to form the S/D regions 1420. An annealing process that activates the dopants and causes them to diffuse farther into the substrate 1402 may follow the ion-implantation process. In the latter process, the substrate 1402 may first be etched to form recesses at the locations of the S/D regions 1420. An epitaxial deposition process may then be carried out to fill the recesses with material that is used to fabricate the S/D regions 1420. In some implementations, the S/D regions 1420 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 1420 may be formed using one or more alternate semiconductor materials such as germanium or a group III-V material or alloy. In further embodiments, one or more layers of metal and/or metal alloys may be used to form the S/D regions 1420.

Electrical signals, such as power and/or input/output (I/O) signals, may be routed to and/or from the devices (e.g., transistors 1440) of the device layer 1404 through one or more interconnect layers disposed on the device layer 1404 (illustrated in FIG. 14 as interconnect layers 1406, 1408, and 1410). For example, electrically conductive features of the device layer 1404 (e.g., the gate 1422 and the S/D contacts 1424) may be electrically coupled with the interconnect structures 1428 of the interconnect layers 1406-1410. The one or more interconnect layers 1406-1410 may form a metallization stack (also referred to as an "ILD stack") 1419 of the IC device 1400.

The interconnect structures 1428 may be arranged within the interconnect layers 1406-1410 to route electrical signals according to a wide variety of designs. In particular, the arrangement is not limited to the particular configuration of interconnect structures 1428 depicted in FIG. 14. Although a particular number of interconnect layers 1406-1410 is depicted in FIG. 14, embodiments of the present disclosure include IC devices having more or fewer interconnect layers than depicted.

In some embodiments, the interconnect structures 1428 may include lines 1428*a* and/or vias 1428*b* filled with an electrically conductive material such as a metal. The lines 1428*a* may be arranged to route electrical signals in a direction of a plane that is substantially parallel with a surface of the substrate 1402 upon which the device layer 1404 is formed. For example, the lines 1428*a* may route electrical signals in a direction in and out of the page from the perspective of FIG. 14. The vias 1428*b* may be arranged to route electrical signals in a direction of a plane that is substantially perpendicular to the surface of the substrate 1402 upon which the device layer 1404 is formed. In some embodiments, the vias 1428*b* may electrically couple lines 1428*a* of different interconnect layers 1406-1410 together.

The interconnect layers 1406-1410 may include a dielectric material 1426 disposed between the interconnect structures 1428, as shown in FIG. 14. In some embodiments, the dielectric material 1426 disposed between the interconnect structures 1428 in different ones of the interconnect layers 1406-1410 may have different compositions; in other embodiments, the composition of the dielectric material 1426 between different interconnect layers 1406-1410 may be the same.

A first interconnect layer 1406 (referred to as Metal 1 or "M1") may be formed directly on the device layer 1404. In some embodiments, the first interconnect layer 1406 may include lines 1428*a* and/or vias 1428*b*, as shown. The lines 1428*a* of the first interconnect layer 1406 may be coupled with contacts (e.g., the S/D contacts 1424) of the device layer 1404.

A second interconnect layer 1408 (referred to as Metal 2 or "M2") may be formed directly on the first interconnect layer 1406. In some embodiments, the second interconnect layer 1408 may include vias 1428*b* to couple the lines 1428*a* of the second interconnect layer 1408 with the lines 1428*a* of the first interconnect layer 1406. Although the lines 1428*a* and the vias 1428*b* are structurally delineated with a line within each interconnect layer (e.g., within the second interconnect layer 1408) for the sake of clarity, the lines 1428*a* and the vias 1428*b* may be structurally and/or materially contiguous (e.g., simultaneously filled during a dual-damascene process) in some embodiments.

A third interconnect layer 1410 (referred to as Metal 3 or "M3") (and additional interconnect layers, as desired) may be formed in succession on the second interconnect layer 1408 according to similar techniques and configurations described in connection with the second interconnect layer 1408 or the first interconnect layer 1406. In some embodiments, the interconnect layers that are "higher up" in the metallization stack 1419 in the IC device 1400 (i.e., farther away from the device layer 1404) may be thicker.

The IC device 1400 may include a solder resist material 1434 (e.g., polyimide or similar material) and one or more conductive contacts 1436 formed on the interconnect layers 1406-1410. In FIG. 14, the conductive contacts 1436 are illustrated as taking the form of bond pads. The conductive contacts 1436 may be electrically coupled with the interconnect structures 1428 and configured to route the electrical signals of the transistor(s) 1440 to other external devices. For example, solder bonds may be formed on the one or more conductive contacts 1436 to mechanically and/or electrically couple a chip including the IC device 1400 with another component (e.g., a circuit board). The IC device 1400 may include additional or alternate structures to route the electrical signals from the interconnect layers 1406-1410; for example, the conductive contacts 1436 may include other analogous features (e.g., posts) that route the electrical signals to external components. The conductive contacts 1436 may serve as the conductive contacts 106, 108, 1006, 1008, or 186, as appropriate.

In some embodiments in which the IC device 1400 is a double-sided die, the IC device 1400 may include another metallization stack (not shown) on the opposite side of the device layer(s) 1404. This metallization stack, may include multiple interconnect layers as discussed above with reference to the interconnect layers 1406-1410, to provide conductive pathways (e.g., including conductive lines and vias) between the device layer(s) 1404 and additional conductive contacts (not shown) on the opposite side of the IC device 1400 from the conductive contacts 1436. In other embodiments in which the IC device 1400 is a double-sided die, the IC device 1400 may include one or more TSVs through the die substrate 1402; these TSVs may make contact with the device layer(s) 1404, and may provide conductive pathways between the device layer(s) 1404 and additional conductive contacts (not shown) on the opposite side of the IC device 1400 from the conductive contacts 1436. These additional conductive contacts may serve as the conductive contacts for any of the double-sided dies discussed herein, as appropriate. Example details of one example type of a double-sided IC device are discussed in further detail in FIG. 15.

Figure 15:
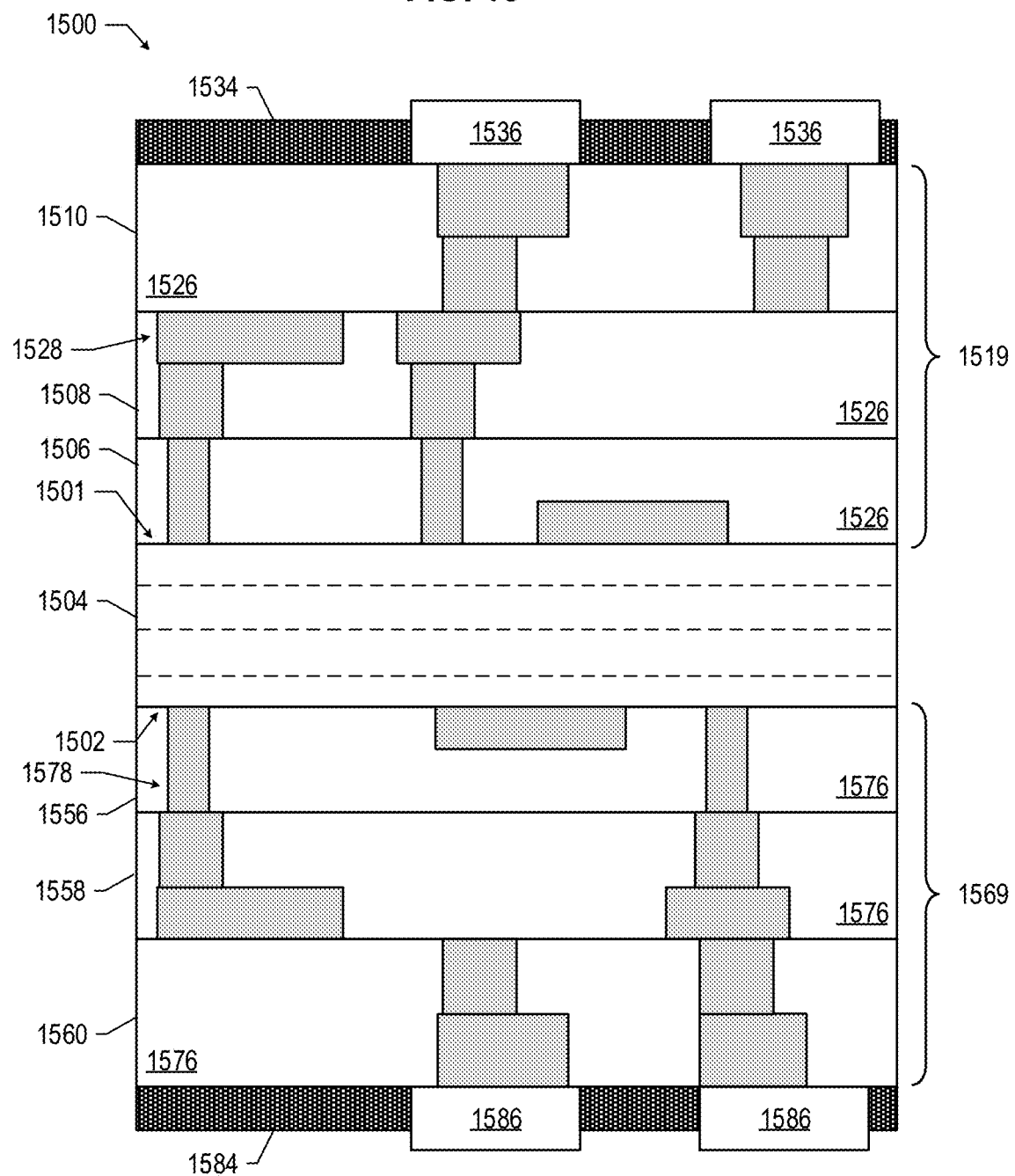
FIG. 15 is a cross-sectional side view of one example type of a double-sided IC device that may be included in a microelectronic assembly, in accordance with any of the embodiments disclosed herein.

FIG. 15 is a side, cross-sectional view of one example type of a double-sided IC device 1500 that may be included in any of the microelectronic assemblies 100 disclosed herein (e.g., in any of the dies 110/180). One or more of the double-sided IC devices 1500 may be included in one or more dies 1302 (FIG. 13). The double-sided IC device 1500 may be composed of semiconductor material systems including, for example, n-type or p-type materials systems (or a combination of both). In some embodiments, the IC device may be composed of alternative materials, which may or may not be combined with silicon, that include but are not limited to germanium, indium antimonide, lead telluride, indium arsenide, indium phosphide, gallium arsenide, or gallium antimonide. Further materials classified as group II-VI, III-V, or IV may also be used to form the double-sided IC device 1500.

The double-sided IC device 1500 may include one or more device layers 1504. The device layers 1504 may include features of one or more transistors (e.g., as discussed in FIG. 14) and/or any other active and/or passive circuitry as may be desired by a device manufacturer.

Electrical signals, such as power and/or input/output (I/O) signals, may be routed to and/or from the devices of the device layers 1504 through one or more interconnect layers disposed on opposing sides of the device layers 1504 (illustrated in FIG. 15 as first interconnect layers 1506, 1508, and 1510 on a first side 1501 of the device layers and second interconnect layers 1556, 1558, and 1560 on an opposing second side 1502 of the device layers 1504). For example, electrically conductive features of the device layers 1504 may be electrically coupled with the first interconnect structures 1528 of the first interconnect layers 1506-1510 and/or with the second interconnect structures 1578 of the second interconnect layers 1556-1560. The one or more first interconnect layers 1506-1510 may form a first metallization stack (e.g., an ILD stack) 1519 and the one or more second interconnect layers 1556-1560 may form a second metallization stack 1569 of the double-sided IC device 1500.

The first interconnect structures 1528 may be arranged within the first interconnect layers 1506-1510 and the second interconnect structures 1578 may be arranged within the second interconnect layers 1556-1560 to route electrical signals according to a wide variety of designs (in particular, the arrangement is not limited to the particular configuration of the first interconnect structures 1528 and the second interconnect structures 1578 depicted in FIG. 15). Although a particular number of first interconnect layers 1506-1510 and a particular number of second interconnect layers 1556-1560 are depicted in FIG. 15, embodiments of the present disclosure include IC devices having more or fewer first and/or second interconnect layers than depicted. Further, the particular number of first interconnect layers and second interconnect layers on opposing sides of the device layers 1504 may be the same or different from each other.

In some embodiments, the first interconnect structures 1528 and/or the second interconnect structures 1578 may include lines and/or vias as discussed herein filled with an electrically conductive material such as a metal. The first interconnect layers 1506-1510 may include a first dielectric material 1526 disposed between the first interconnect structures 1528, as shown in FIG. 15. In some embodiments, the first dielectric material 1526 disposed between the first interconnect structures 1528 in different ones of the first interconnect layers 1506-1510 may have different compositions; in other embodiments, the composition of the first dielectric material 1526 between different first interconnect layers 1506-1510 may be the same. The second interconnect layers 1556-1560 may include a second dielectric material 1576 disposed between the second interconnect structures 1578, as shown in FIG. 15. In some embodiments, the second dielectric material 1576 disposed between the second interconnect structures 1578 in different ones of the second interconnect layers 1556-1560 may have different compositions; in other embodiments, the composition of the second dielectric material 1576 between different second interconnect layers 1556-1560 may be the same. In some embodiments, the composition of the first dielectric material 1526 and the second dielectric material 1576 may be different; in other embodiments, the composition of the first dielectric material 1526 and the second dielectric material 1576 may be the same. The first interconnect layers 1506-1510 and the second interconnect layers 1556-1560 may be formed using any techniques as discussed herein (e.g., composed of M1-M3 layers, etc.).

The double-sided IC device 1500 may include a first solder resist material 1534 (e.g., polyimide or similar material) and one or more first conductive contacts 1536 formed on the first interconnect layers 1506-1510. The double-sided IC device 1500 may include a second solder resist material 1584 (e.g., polyimide or similar material) and one or more second conductive contacts 1586 formed on the second interconnect layers 1556-1560. In some embodiments, the composition of the first solder resist material 1534 and the second solder resist material 1584 may be the same; in other embodiments, the composition of the first solder resist material 1534 and the second solder resist material 1584 may be different.

In FIG. 15, the first conductive contacts 1536 and the second conductive contacts 1586 are illustrated as taking the form of bond pads. The first conductive contacts 1536 may be electrically coupled with the first interconnect structures 1528 and the second conductive contacts 1586 may be electrically coupled with the second interconnect structures 1578. In some embodiments, TSV interconnect structures may be integrated into the double-sided IC device 1500; in such embodiments, the first conductive contacts 1536 and the second conductive contacts 1586 may be electrically coupled via one or more TSV interconnect structures. The double-sided IC device 1500 may include additional or alternate structures to route the electrical signals from the first interconnect layers 1506-1510 and/or the second interconnect layers 1556-1560; for example, the first conductive contacts 1536 and/or the second conductive contacts 1586 may include other analogous features (e.g., posts) that route the electrical signals to external components. The conductive contacts 1536 and/or 1586 may serve as the conductive contacts 106, 108, 1006, 1008, or 186, as appropriate.

Figure 16:
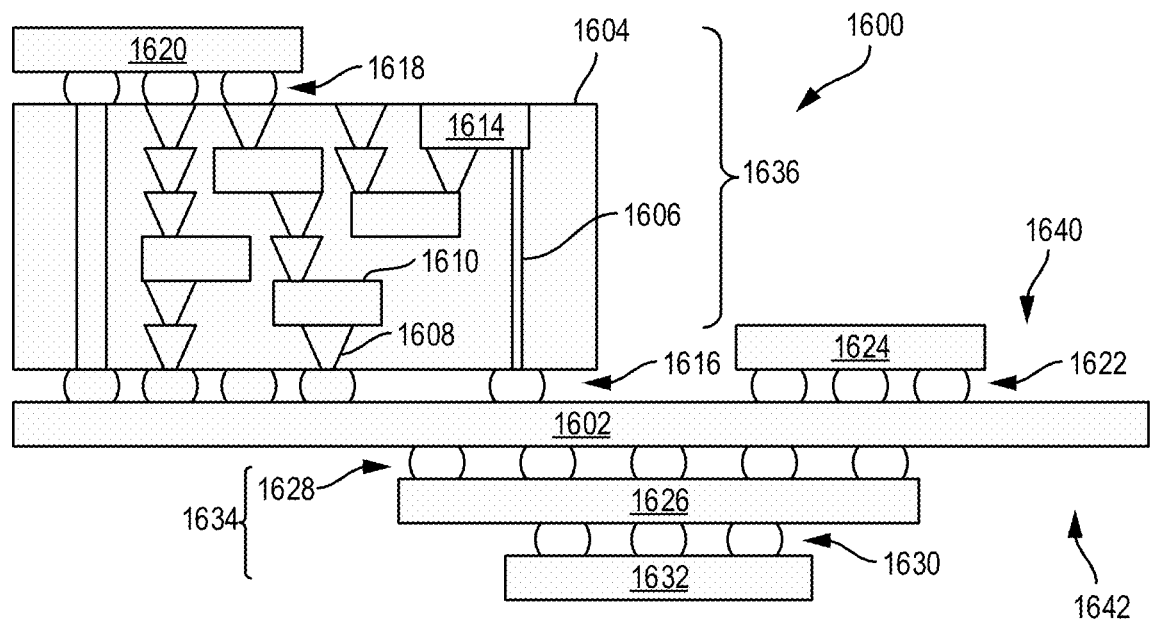
FIG. 16 is a cross-sectional side view of an IC device assembly that may include a microelectronic assembly, in accordance with any of the embodiments disclosed herein.

FIG. 16 is a cross-sectional side view of an IC device assembly 1600 that may include any of the microelectronic assemblies 100 disclosed herein. In some embodiments, the IC device assembly 1600 may be a microelectronic assembly 100. The IC device assembly 1600 includes a number of components disposed on a circuit board 1602 (which may be, e.g., a motherboard). The IC device assembly 1600 includes components disposed on a first face 1640 of the circuit board 1602 and an opposing second face 1642 of the circuit board 1602; generally, components may be disposed on one or both faces 1640 and 1642. Any of the IC packages discussed below with reference to the IC device assembly 1600 may take the form of any suitable ones of the embodiments of the microelectronic assemblies 100 disclosed herein.

In some embodiments, the circuit board 1602 may be a PCB including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1602. In other embodiments, the circuit board 1602 may be a non-PCB substrate.

The IC device assembly 1600 illustrated in FIG. 16 includes a package-on-interposer structure 1636 coupled to the first face 1640 of the circuit board 1602 by coupling components 1616. The coupling components 1616 may electrically and mechanically couple the package-on-interposer structure 1636 to the circuit board 1602, and may include solder balls (as shown in FIG. 16), male and female portions of a socket, an adhesive, an underfill material, and/or any other suitable electrical and/or mechanical coupling structure.

The package-on-interposer structure 1636 may include an IC package 1620 coupled to an interposer 1604 by coupling components 1618. The coupling components 1618 may take any suitable form for the application, such as the forms discussed above with reference to the coupling components 1616. Although a single IC package 1620 is shown in FIG. 16, multiple IC packages may be coupled to the interposer 1604; indeed, additional interposers may be coupled to the interposer 1604. The interposer 1604 may provide an intervening substrate used to bridge the circuit board 1602 and the IC package 1620. The IC package 1620 may be or include, for example, a die (the die 1302 of FIG. 13), an IC device (e.g., the IC device 1400 of FIG. 14 or the double-sided IC device 1500 of FIG. 15), or any other suitable component. Generally, the interposer 1604 may spread a connection to a wider pitch or reroute a connection to a different connection. For example, the interposer 1604 may couple the IC package 1620 (e.g., a die) to a set of ball grid array (BGA) conductive contacts of the coupling components 1616 for coupling to the circuit board 1602. In the embodiment illustrated in FIG. 16, the IC package 1620 and the circuit board 1602 are attached to opposing sides of the interposer 1604; in other embodiments, the IC package 1620 and the circuit board 1602 may be attached to a same side of the interposer 1604. In some embodiments, three or more components may be interconnected by way of the interposer 1604.

In some embodiments, the interposer 1604 may be formed as a PCB, including multiple metal layers separated from one another by layers of dielectric material and interconnected by electrically conductive vias. In some embodiments, the interposer 1604 may be formed of an epoxy resin, a fiberglass-reinforced epoxy resin, an epoxy resin with inorganic fillers, a ceramic material, or a polymer material such as polyimide. In some embodiments, the interposer 1604 may be formed of alternate rigid or flexible materials that may include the same materials described above for use in a semiconductor substrate, such as silicon, germanium, and other group III-V and group IV materials. The interposer 1604 may include metal interconnects 1608 and vias 1610, including but not limited to TSVs 1606. The interposer 1604 may further include embedded devices 1614, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as RF devices, power amplifiers, power management devices, antennas, arrays, sensors, and microelectromechanical systems (MEMS) devices may also be formed on the interposer 1604. The package-on-interposer structure 1636 may take the form of any of the package-on-interposer structures known in the art.

The IC device assembly 1600 may include an IC package 1624 coupled to the first face 1640 of the circuit board 1602 by coupling components 1622. The coupling components 1622 may take the form of any of the embodiments discussed above with reference to the coupling components 1616, and the IC package 1624 may take the form of any of the embodiments discussed above with reference to the IC package 1620.

The IC device assembly 1600 illustrated in FIG. 16 includes a package-on-package structure 1634 coupled to the second face 1642 of the circuit board 1602 by coupling components 1628. The package-on-package structure 1634 may include an IC package 1626 and an IC package 1632 coupled together by coupling components 1630 such that the IC package 1626 is disposed between the circuit board 1602 and the IC package 1632. The coupling components 1628 and 1630 may take the form of any of the embodiments of the coupling components 1616 discussed above, and the IC packages 1626 and 1632 may take the form of any of the embodiments of the IC package 1620 discussed above. The package-on-package structure 1634 may be configured in accordance with any of the package-on-package structures known in the art.

Figure 17:
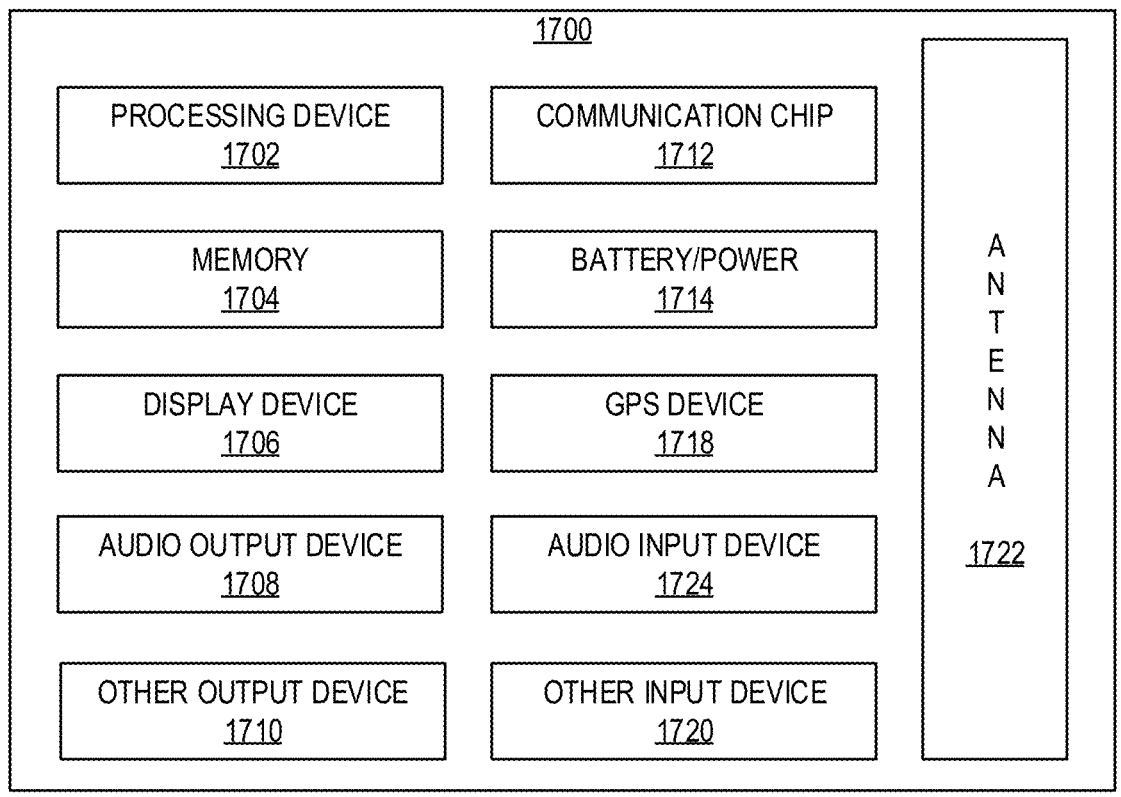
FIG. 17 is a block diagram of an example computing device that may include a microelectronic, in accordance with any of the embodiments disclosed herein.

FIG. 17 is a block diagram of an example computing device 1700 that may include one or more of the microelectronic assemblies 100 disclosed herein. For example, any suitable ones of the components of the computing device 1700 may include one or more of the IC device assemblies 1600, IC devices 1400, double-sided IC devices 1500 or dies 1302 disclosed herein, and may be arranged in any of the microelectronic assemblies 100 disclosed herein. A number of components are illustrated in FIG. 17 as included in the computing device 1700, but any one or more of these components may be omitted or duplicated, as suitable for the application. In some embodiments, some or all of the components included in the computing device 1700 may be attached to one or more motherboards. In some embodiments, some or all of these components are fabricated onto a single system-on-a-chip (SoC) die.

Additionally, in various embodiments, the computing device 1700 may not include one or more of the components illustrated in FIG. 17, but the computing device 1700 may include interface circuitry for coupling to the one or more components. For example, the computing device 1700 may not include a display device 1706, but may include display device interface circuitry (e.g., a connector and driver circuitry) to which a display device 1706 may be coupled. In another set of examples, the computing device 1700 may not include an audio input device 1724 or an audio output device 1708, but may include audio input or output device interface circuitry (e.g., connectors and supporting circuitry) to which an audio input device 1724 or audio output device 1708 may be coupled.

The computing device 1700 may include a processing device 1702 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1702 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The computing device 1700 may include a memory 1704, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the memory 1704 may include memory that shares a die with the processing device 1702. This memory may be used as cache memory and may include embedded dynamic random access memory (eDRAM) or spin transfer torque magnetic random access memory (STT-MRAM).

In some embodiments, the computing device 1700 may include a communication chip 1712 (e.g., one or more communication chips). For example, the communication chip 1712 may be configured for managing wireless communications for the transfer of data to and from the computing device 1700. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 1712 may implement any of a number of wireless standards or protocols, including but not limited to Institute of Electrical and Electronic Engineers (IEEE) standards including Wi-Fi (IEEE 802.11 family), IEEE 802.16 standards (e.g., IEEE 802.16-2005 Amendment), 3rd Generation Partnership Project (3GPP) Long-Term Evolution (LTE), 5G, 5G New Radio, along with any amendments, updates, and/or revisions (e.g., advanced LTE project, ultra-mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1712 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1712 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1712 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1712 may operate in accordance with other wireless protocols in other embodiments. The computing device 1700 may include an antenna 1722 to facilitate wireless communications and/or to receive other wireless communications (such as AM or FM radio transmissions).

In some embodiments, the communication chip 1712 may manage wired communications, such as electrical, optical, or any other suitable communication protocols (e.g., the Ethernet). As noted above, the communication chip 1712 may include multiple communication chips. For instance, a first communication chip 1712 may be dedicated to shorter-range wireless communications such as Wi-Fi or Bluetooth, and a second communication chip 1712 may be dedicated to longer-range wireless communications such as global positioning system (GPS), EDGE, GPRS, CDMA, WiMAX, LTE, EV-DO, or others. In some embodiments, a first communication chip 1712 may be dedicated to wireless communications, and a second communication chip 1712 may be dedicated to wired communications.

The computing device 1700 may include battery/power circuitry 1714. The battery/power circuitry 1714 may include one or more energy storage devices (e.g., batteries or capacitors) and/or circuitry for coupling components of the computing device 1700 to an energy source separate from the computing device 1700 (e.g., AC line power).

The computing device 1700 may include a display device 1706 (or corresponding interface circuitry, as discussed above). The display device 1706 may include any visual indicators, such as a heads-up display, a computer monitor, a projector, a touchscreen display, a liquid crystal display (LCD), a light-emitting diode display, or a flat panel display.

The computing device 1700 may include an audio output device 1708 (or corresponding interface circuitry, as discussed above). The audio output device 1708 may include any device that generates an audible indicator, such as speakers, headsets, or earbuds.

The computing device 1700 may include an audio input device 1724 (or corresponding interface circuitry, as discussed above). The audio input device 1724 may include any device that generates a signal representative of a sound, such as microphones, microphone arrays, or digital instruments (e.g., instruments having a musical instrument digital interface (MIDI) output).

The computing device 1700 may include a GPS device 1718 (or corresponding interface circuitry, as discussed above). The GPS device 1718 may be in communication with a satellite-based system and may receive a location of the computing device 1700, as known in the art.

The computing device 1700 may include a other output device 1710 (or corresponding interface circuitry, as discussed above). Examples of the other output device 1710 may include an audio codec, a video codec, a printer, a wired or wireless transmitter for providing information to other devices, or an additional storage device.

The computing device 1700 may include a other input device 1720 (or corresponding interface circuitry, as discussed above). Examples of the other input device 1720 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 1700 may have any desired form factor, such as a handheld or mobile electrical device (e.g., a cell phone, a smart phone, a mobile internet device, a music player, a tablet computer, a laptop computer, a netbook computer, an ultrabook computer, a personal digital assistant (PDA), an ultra-mobile personal computer, etc.), a desktop electrical device, a server or other networked computing component, a printer, a scanner, a monitor, a set-top box, an entertainment control unit, a vehicle control unit, a digital camera, a digital video recorder, or a wearable electrical device. In some embodiments, the computing device 1700 may be any other electronic device that processes data.

The following paragraphs provide various examples of the embodiments disclosed herein.

Example 1 is a microelectronic assembly including: a die having a front side and a back side, the die including a first material and conductive contacts at the front side; and a thermal layer attached to the back side of the die, the thermal layer including a second material and a conductive pathway, wherein the conductive pathway extends from a front side of the thermal layer to a back side of the thermal layer.

Example 2 may include the subject matter of Example 1 and may further specify that the conductive pathway of the thermal layer is electrically interconnected with a device layer of the die.

Example 3 may include the subject matter of Example of 1 and may further specify that the conductive pathway is not electrically interconnected with a device layer of the die.

Example 4 may include the subject matter of Example 1 and may further specify that the first material and the second material are a different material.

Example 5 may include the subject matter of Example 4 and may further specify that the second material includes a semiconductor material or a metal.

Example 6 may include the subject matter of Example 4 and may further specify that the second material includes glass.

Example 7 may include the subject matter of Example 4 and may further specify that the second material includes ceramic.

Example 8 may include the subject matter of Example 1 and may further specify that the first semiconductor material and the second semiconductor material are a same material.

Example 9 may include the subject matter of Example 1 and may further specify that the conductive pathway is an individual one of a plurality of conductive pathways of the thermal layer.

Example 10 may include the subject matter of Example 9 and may further specify that at least two conductive pathways have a different width.

Example 11 may include the subject matter of Example 1 and may further specify that the conductive pathway is a portion of an electrical device of the thermal layer.

Example 12 may include the subject matter of Example 11 and may further specify that the electrical device is at least one of: an antenna; and an inductor.

Example 13 may include the subject matter of any of Examples 1-12 and may further specify that the conductive pathway has a width between 1 micron and 300 microns.

Example 14 may include the subject matter of any of Examples 1-13 and may further specify that the conductive pathway is an individual one of a plurality of conductive pathways of the thermal layer and at least two conductive pathways have a spacing between 2 microns and 600 microns.

Example 15 may include the subject matter of any of Examples 1-14 and may further specify that the thermal layer has a thickness between 30 microns and 300 microns.

Example 16 may include the subject matter of any of Examples 1-15 and may further specify that the conductive pathway is coupled to another die.

Example 17 is a computing device including: a die having a front side and a back side, the die including a first material; and a thermal layer coupled to the back side of the die, the thermal layer including a second material and a conductive pathway, wherein the conductive pathway extends from a front side of the thermal layer to a back side of the thermal layer.

Example 18 may include the subject matter of Example 17 and may further specify that the first material and the second material are a different material.

Example 19 may include the subject matter of Example 17 and may further specify that the conductive pathway is an individual one of a plurality of conductive pathways of the thermal layer.

Example 20 may include the subject matter of Example 19 and may further specify that at least two conductive pathways have a different width.

Example 21 may include the subject matter of Example 20 and may further include at least one electrical interconnection at the back side of the thermal layer between at least two conductive pathways of the thermal layer.

Example 22 may include the subject matter of Example 21 and may further specify that the at least one electrical interconnection is a portion of an electrical device of the thermal layer.

Example 23 may include the subject matter of Example 22 and may further specify that the electrical device is an inductor.

Example 24 may include the subject matter of Example 17 and may further specify that the conductive pathway is a portion of an electrical device of the thermal layer.

Example 25 may include the subject matter of Example 24 and may further specify that the electrical device is at least one of: an antenna; and an inductor.

Example 26 may include the subject matter of any of Examples 17-25 and may further specify that the conductive pathway has a width between 1 micron and 300 microns.

Example 27 may include the subject matter of any of Examples 17-26 and may further specify that the conductive pathway is an individual one of a plurality of conductive pathways of the thermal layer and at least two conductive pathways have a spacing between 2 microns and 600 microns.

Example 28 may include the subject matter of any of Examples 17-27 and may further specify that the thermal layer has a thickness between 30 microns and 300 microns.

Example 29 may include the subject matter of any of Examples 17-28 and may further specify that the conductive pathway is coupled to another die.

Example 30 may include the subject matter of any of Examples 17-29 and may further specify that the computing device is a handheld computing device.

Example 31 may include the subject matter of any of Examples 17-30 and may further specify that the thermal layer has a thickness between 30 microns and 300 microns.

Example 32 is a method of manufacturing a microelectronic assembly that includes: forming a conductive pathway in a thermal layer, wherein the thermal layer includes a first material; and attaching a die to the thermal layer, wherein the die includes a second material.

Example 33 may include the subject matter of Example 32 and may further specify that the conductive pathway extends from a front side of the thermal layer to a backside of the thermal layer.

Example 34 may include the subject matter of Example 32 and may further specify that the conductive pathway extends from a front side of the thermal layer to a distance that is less than a thickness of the thermal layer.

Example 35 may include the subject matter of Example 34 and may further include removing a portion of the thermal layer following the attaching to expose the conductive pathway.

Example 36 may include the subject matter of Example 32 and may further specify that the conductive pathway is an individual one of a plurality of conductive pathways formed in the thermal layer.

Example 37 may include the subject matter of any of Examples 32-36 and may further specify that the attaching includes at least one of: forming solder interconnects between the die and the thermal layer; forming copper-to-copper interconnects between the die and the thermal layer; forming anisotropic material interconnects between the die and the thermal layer; and bonding the die and the thermal layer by a direct bonding process or a hybrid bonding process.

Example 38 may include the subject matter of any of Examples 32-37 and may further specify that the conductive pathway is an individual one of a plurality of conductive pathways of the thermal layer and at least two conductive pathways have a spacing between 2 microns and 600 microns.

Example 39 may include the subject matter of any of Examples 32-38 and may further specify that the thermal layer has a thickness between 30 microns and 300 microns.

Example 40 may include the subject matter of any of Examples 32-39 and may further specify that the first material and the second material are a different material.

Example 41 may include the subject matter of any of Examples 32-40 and may further specify that the second material includes a semiconductor material or a metal.

Example 42 may include the subject matter of any of Examples 32-41 and may further specify that the second material includes glass.

Example 43 may include the subject matter of any of Examples 32-42 and may further specify that the second material includes ceramic.

Example 44 may include the subject matter of any of Examples 32-43 and may further specify that the first semiconductor material and the second semiconductor material are a same material.

The invention claimed is:

1. A microelectronic assembly, comprising:
   a die having a front side and a back side, the die comprising a semiconductor material and conductive contacts at the front side; and
   a thermal layer attached to the back side of the die, the thermal layer comprising the semiconductor material and a plurality of conductive pathways extending from a front side of the thermal layer to a back side of the thermal layer, wherein at least one of the plurality of conductive pathways in the thermal layer is coupled to the back side of the die by a metal-to-metal interconnect, by a solder interconnect, or by an anisotropic conductive material, and wherein the plurality of conductive pathways include first conductive pathways having a first pitch and second conductive pathways having a second pitch different from the first pitch.

2. The microelectronic assembly of claim 1, wherein at least one of the plurality of conductive pathways of the thermal layer is electrically interconnected with a device layer of the die.

3. The microelectronic assembly of claim 1, wherein at least one of the plurality of conductive pathways is not electrically interconnected with a device layer of the die.

4. The microelectronic assembly of claim 1, wherein the semiconductor material of the die is a first semiconductor material and the semiconductor material of the thermal layer is a second semiconductor material.

5. The microelectronic assembly of claim 1, wherein the semiconductor material includes one or more of group II-VI, III-V, or IV materials.

6. The microelectronic assembly of claim 1, wherein the semiconductor material includes one or more of silicon, germanium, indium antimonide, lead telluride, indium arsenide, indium phosphide, gallium arsenide, sapphire, diamond, glass, ceramic, or gallium antimonide.

7. The microelectronic assembly of claim 1, wherein at least two conductive pathways of the plurality of conductive pathways of the thermal layer have a different width.

8. The microelectronic assembly of claim 1, wherein at least one of the plurality of conductive pathways is a portion of an electrical device of the thermal layer.

9. The microelectronic assembly of claim 8, wherein the electrical device is at least one of:
an antenna; and an inductor.

10. The microelectronic assembly of claim 1, wherein the thermal layer has a thickness between 30 microns and 300 microns.

11. A computing device, comprising:
a die having a front side and a back side, the die comprising a semiconductor material; and
a thermal layer coupled to the back side of the die, the thermal layer comprising the semiconductor material and a plurality of conductive pathways extending from a front side of the thermal layer to a back side of the thermal layer, wherein at least one of the plurality of conductive pathways in the thermal layer is coupled to the back side of the die by a metal-to-metal interconnect, by a solder interconnect, or by an anisotropic conductive material, and wherein the plurality of conductive pathways include first conductive pathways having a first pitch and second conductive pathways having a second pitch different from the first pitch.

12. The computing device of claim 11, wherein the semiconductor material of the die is a first semiconductor material and the semiconductor material of the thermal layer is a second semiconductor material.

13. The computing device of claim 11, wherein at least two conductive pathways of the plurality of conductive pathways have a different width.

14. The computing device of claim 11, further comprising at least one electrical interconnection at the back side of the thermal layer between at least two conductive pathways of the plurality of conductive pathways of the thermal layer.

15. The computing device of claim 14, wherein the at least one electrical interconnection is a portion of an electrical device of the thermal layer.

16. The computing device of claim 15, wherein the electrical device is an inductor.

17. The computing device of claim 11, wherein the computing device is a handheld computing device.

18. The computing device of claim 11, wherein the thermal layer has a thickness between 30 microns and 300 microns.

* * * * *

UNITED STATES PATENT AND TRADEMARK OFFICE
CERTIFICATE OF CORRECTION

| | |
|---|---|
| PATENT NO. | : 11,393,777 B2 |
| APPLICATION NO. | : 16/651888 |
| DATED | : July 19, 2022 |
| INVENTOR(S) | : Adel A. Elsherbini et al. |

It is certified that error appears in the above-identified patent and that said Letters Patent is hereby corrected as shown below:

On the Title Page

In Item (57), under "Abstract", in Column 2, Line 3, delete "may a die" and insert -- may include a die --, therefor.

Signed and Sealed this
Fourth Day of April, 2023

*Katherine Kelly Vidal*

Katherine Kelly Vidal
*Director of the United States Patent and Trademark Office*